United States Patent [19]

Kimura

[11] Patent Number: 5,500,623
[45] Date of Patent: Mar. 19, 1996

[54] DIFFERENTIAL AMPLIFIER CIRCUIT WITH ALMOST LINEAR TRANSCONDUCTANCE

[75] Inventor: Katsuji Kimura, Tokyo, Japan

[73] Assignee: NEC Corporation, Tokyo, Japan

[21] Appl. No.: 162,960

[22] Filed: Dec. 8, 1993

[30] Foreign Application Priority Data

Dec. 8, 1992 [JP] Japan .................................. 4-351747

[51] Int. Cl.$^6$ ...................................................... H03F 3/45
[52] U.S. Cl. .......................................... 330/252; 330/253
[58] Field of Search ..................................... 330/252, 253, 330/295; 307/494

[56] References Cited

U.S. PATENT DOCUMENTS 4,965,528  10/1990  Okanobu ................................. 330/252

FOREIGN PATENT DOCUMENTS 0312016  4/1989  European Pat. Off. .
3027071  2/1982  Germany .

OTHER PUBLICATIONS

P. Wu et al., "A CMOS OTA with Improved Linearity Based on Current Addition", IEEE International Symposium on Circuits and Systems, May 1990, pp. 2297–2299.
G. A. De Veirman et al., "Design of a Bipolar 10–MHz Programmable . . . Linear Phase Filter", IEEE Journal of Solid–State Circuits, vol. 27, No. 3, Mar. 1992, pp. 324–331.
Z. Czarnul et al., "Highly–Linear Transconductor Cell Realised by Double MOS Transistor . . . Pairs", Electronics Letters, vol. 26, No. 21, Oct. 11, 1990, pp. 1819–1821.
G. Wilson et al., "Comparison of four CMOS transconductors for fully integrated . . . applications", IEE Proceedings–G, vol. 138, No. 6, Dec. 1991, pp. 683–688.
A. Nedungadi et al., "Design of Linear CMOS Transconductance Elements", IEEE Transactions on Circuits and Systems, vol. CAS–31, No. 10, Oct. 1984, pp. 891–894.
Koyama, M. et al, "A 10/7 MHz Continuous–Time Bandpass Filter Bipolar IC", *IEEE 1989 Custom Integrated Circuits Conference*, 1989, pp. 25.2.2–25.2.4.
A. Nedungadi et al, "Design of Linear CMOS Transconductance Elements", *IEEE Transactions on Circuits and Systems*, vol. CAS–31, No. 10, Oct. 1984, pp. 891–894.

*Primary Examiner*—Steven Mottola
*Attorney, Agent, or Firm*—Sughrue, Mion, Zinn, Macpeak & Seas

[57] ABSTRACT

A differential amplifier circuit having an improved transconductance linearity, which includes a first to fourth unbalanced differential pairs of MOS transistors. In each differential pair, a ratio (W/L) of a gate-width W and a gate-length L of one transistor is different from that of the other transistor. Gates of the transistors having smaller ratios of the first and third pairs and gates of the transistors having larger ratios of the second and fourth pairs are coupled together to form one of differential input ends. Gates of the transistors having larger ratios of the first and third pairs and gates of the transistors having smaller ratios of the second and fourth pairs are coupled together to form the other of the input ends. Drains of the transistors having smaller ratios of the first and second pairs and drains of the transistors having larger ratios of the third and fourth pairs are coupled together to form one of differential output ends. Drains of the transistors having larger ratios of the first and second pairs and drains of the transistors having smaller ratios of the third and fourth pairs are coupled together to form the other of the output ends.

14 Claims, 14 Drawing Sheets

DIFFERENTIAL AMPLIFIER CIRCUIT WITH ALMOST LINEAR TRANSCONDUCTANCE

BACKGROUND OF THE INVENTION

1. Field of the Invention

The present invention relates to a differential amplifier circuit and more particularly, to a differential amplifier circuit to be formed on Complementary Metal Oxide Semiconductor (CMOS) integrated circuits or on bipolar integrated circuits, which has an improved transconductance linearity.

2. Description of the Prior Art

FIG. 1 shows an example of conventional differential amplifier circuits with a CMOS structure whose transconductance linearity is improved.

The differential amplifier circuit shown in FIG. 1 is composed of a first differential pair of MOS transistors M11 and M12 which are driven by a constant current source 51 (current: $I_0$) and a second differential pair of MOS transistors M13 and M14 which are driven by a constant current source 52 (current: $aI_0$, $a \neq 1$). The transistor M11 has the same ratio (W/L) between its gate length L and gate width W as that of the transistor M12, and the transistor M13 has the same ratio (W/L) between its gate length L and gate width W as that of the transistor M14. When the transconductance parameters of the transistors M11 and M12 are both defined as $\beta$, the transconductance parameters of the transistors M13 and M14 are $b\beta$ where $b \neq 1$, respectively.

The transconductance parameter $\beta$ is expressed as $$\beta = \mu(C_{OX}/2)(W/L) \tag{1}$$

where $\mu$ is the effective surface carrier mobility and $C_{OX}$ is a gate-oxide capacity per unit area.

In FIG. 1, the gates of the transistors M11 and M14 coupled together and the gates of the transistors M12 and M13 coupled together form differential input ends of the differential amplifier circuit. An input voltage $V_{in}$ is applied to the differential input ends.

The drains of the transistors M11 and M13 coupled together and the drains of the transistors M12 and M14 coupled together form differential output ends of the differential amplifier circuit.

The sources of the transistors M11 and M12 are connected in common to the constant current source 51 and the sources of the transistors M13 and M14 are connected in common to the constant current source 52.

Assuming that the transistors M11, M12, M13 and M14 are operating at their saturation regions, drain currents $I_{d11}$ and $I_{d12}$ of the transistors M11 and M12 are respectively expressed as the following equations (2-1) and (2-2) using the transconductance parameter $\beta$, the threshold voltage $V_{TH}$ of the transistors M11, M12, M13 and M14 and gate-source voltages $V_{GS11}$ and $V_{GS12}$ of the transistor M11 and M12.

$$I_{d11} = \beta(V_{GS11} - V_{TH})^2 \tag{2-1}$$

$$I_{d12} = \beta(V_{GS12} - V_{TH})^2 \tag{2-2}$$

The drain currents $I_{d11}$ and $I_{d12}$ satisfies the relationship as $I_{d11} + I_{d12} = I_0$.

Accordingly, the difference of the drain currents $I_{d11}$ and $I_{d12}$ is given as the following equations (3-1), (3-2) and (3-3).

$$I_{d11} - I_{d12} = \beta V_{in} \sqrt{(2I_0/\beta) - V_{in}^2} \quad (|V_{in}| \leq \sqrt{I_0/\beta}) \tag{3-1}$$

$$I_{d11} - I_{d12} = I_0 \quad (V_{in} \geq \sqrt{I_0/\beta}) \tag{3-2}$$

$$I_{d11} - I_{d12} = -I_0 \quad (V_{in} \leq -\sqrt{I_0/\beta}) \tag{3-3}$$

In the equations (3-1), (3-2) and (3-3), the input voltage $V_{in}$ satisfies the expression as $V_{in} = V_{GS11} - V_{GS12}$.

Drain currents $I_{d13}$ and $I_{d14}$ of the transistors M13 and M14 can be expressed as equations similar to the equations (2-1) and (2-2), respectively. Here, the drain currents $I_{d13}$ and $I_{d14}$ satisfies the relationship as $I_{d13} + I_{d14} = aI_0$, so that the difference of the drain currents $I_{d13}$ and $I_{d14}$ is expressed as the following equations (4-1), (4-2) and (4-3), where $a < (a/b) < 1$.

$$I_{d3} - I_{d4} = b\beta V_{in} \sqrt{(2aI_0)/(b\beta) - V_{in}^2} \quad (|V_{in}| \leq \sqrt{(aI_0)/(b\beta)}) \tag{4-1}$$

$$I_{d3} - I_{d4} = aI_0 \quad (|V_{in}| \geq \sqrt{(aI_0)/(b\beta)}) \tag{4-2}$$

$$I_{d3} - I_{d4} = -aI_0 \quad (|V_{in}| \leq -\sqrt{(aI_0)/(b\beta)}) \tag{4-3}$$

The differential output current $\Delta I$ of the differential amplifier circuit shown in FIG. 1 is given as the following equations (5-1), (5-2) and (5-3).

$$\begin{aligned}\Delta I &= (I_{d1} + I_{d4}) - (I_{d2} + I_{d3}) \\ &= (I_{d1} - I_{d2}) - (I_{d3} - I_{d4}) \\ &= -\beta V_{in} \left[ \sqrt{(2I_0/\beta) - V_{in}^2} - b\sqrt{(2aI_0)/(b\beta) - V_{in}^2} \right] \quad (|V_{in}| \leq \sqrt{(2aI_0)/(b\beta)}) \end{aligned} \tag{5-1}$$

$$\Delta I = \beta V_{in} \sqrt{(2I_0)/\beta - V_{in}^2} - aI_0 \, \text{sgn}(V_{in}) \quad (\sqrt{(aI_0)/(b\beta)} \leq |V_{in}| \leq \sqrt{I_0/\beta}) \tag{5-2}$$

$$\Delta I = (1-a)I_0 \, \text{sgn}(V_{in}) \quad (|V_{in}| \leq \sqrt{I_0/\beta}) \tag{5-3}$$

The differential output current $\Delta I$ shown as the equations (5-1), (5-2) and (5-3) is differentiated by the input voltage $V_{in}$. To make the transconductance substantially constant in the equations (5-1), (5-2) and (5-3), the values of the equation obtained by the differentiation when $V_{in} = 0$ and $|V_{in}| = \{(aI_0)/(b\beta)\}^{1/2}$ are required to be equal to each other. Therefore, the following relationship has to be satisfied as $$1 = (b \cdot b^{1/2})/a^{1/2} \tag{6}$$

FIG. 2 shows the transconductance characteristics of the conventional differential amplifier circuit shown in FIG. 1 with the constants a and b as parameters. In FIG. 2, it is seen that the fluctuation of the transconductance is limited to 3% or less in the input voltage range of $|V_{in}| \leq 0.7(I_0/\beta)^{1/2}$.

FIG. 3 shows another example of the conventional differential amplifier circuits whose transconductance is good in linearity, which is disclosed by A. Nedungadi and T. R. Viswanathan in IEEE TRANSACTIONS ON CIRCUITS AND SYSTEMS, Vol. CAS-31, No.10, pp. 891–894, October 1984, entitled "Design of Linear CMOS transconductance Elements".

In this paper, they supposed that when the gate lengths of two MOS transistors forming each unbalanced differential pair were equal to each other, the differential amplifier circuit which are composed of two of the unbalanced differential pairs whose output ends are cross-coupled would have improved linearity of the transconductance if a ratio of the gate widths of the MOS transistors forming each unbalanced differential pair were larger. Then, they obtained a conclusion through the SPICE simulation in which the ratio of the gate widths are 10 and 20 and that the ratio of the gate widths was required to be 10 or more.

Additionally, they thought that the above-mentioned conclusion is not practical since such a large ratio as 10 or more leads to a large chip area. Therefore, they proposed the differential amplifier circuit shown in FIG. 3.

In FIG. 3, there is provided a "Cross-Coupled Quad Cell" formed of MOS transistors M21, M22, M23 and M24 as a squaring circuit thereby to improve the transconductance linearity of a balanced differential pair formed of MOS transistors M26 and M27 having the same gate-width to gate-length ratio (W/L).

The MOS transistors M21 and M24 compose a first differential pair and the MOS transistors M23 and M22 compose a second differential pair. The first differential pair is driven by a constant current source 61 which is connected to the common-connected sources of the transistors M21 and M24 and generates a constant current (n+1)I. The second differential pair is driven by a constant current source 62 which is connected to the common-connected sources of the transistors M23 and M22 and generates a constant current (n+1)I.

The transconductance parameters of the transistors M21 and M22 are $k_0$ and those of the transistors M23 and M24 are n times as much as $k_0$, or $nk_0$. The MOS transistor with the transconductance parameter $nk_0$ is generally realized by n in number of the unit transistors with the transconductance parameter $k_0$ which are connected in parallel.

The MOS transistors M26 and M27 whose sources are connected in common at a point B compose a differential pair, which is driven by a constant current source 63 generating a constant current aI. The constant current source 63 is connected to the differential pair at the point B and generates a constant current aI. The transconductance parameters of the transistors M26 and M27 are $k_0$.

The gates of the transistors M26, M21 and M23 are coupled together to be applied with a first input voltage $V_1$. The gates of the transistors M27, M22 and M24 are coupled together to be applied with a second input voltage $V_2$.

The drains of the transistors M23 and M24 are connected in common to a voltage source (voltage: $V^+$). The drains of the transistors M21 and M22 are coupled together at a point A, and between the drains thus coupled together and the voltage source, there is provided with a constant current source 64 which generates a constant current aI. An MOS transistor 25 whose drain and gate are connected to each other is provided between the points A and B. The transistor M25 serves as a current level shifter for shifting the current level at the point A to that at the point B.

MOS transistors M28 and M29 compose a current mirror circuit serving as an active load of the differential amplifier circuit. An output current i of the differential amplifier circuit is derived from the drain of the transistor M29.

In the conventional differential amplifier circuit shown in FIG. 3, in the range of $|x| \leq (n+1)^{1/2}$ where $V_1 - V_2 = v$ and $x = v/(I/k_0)^{1/2}$, the drain current $I_{D21}$, $I_{D22}$, $I_{D23}$ and $I_{D24}$ of the transistors M21, M22, M23 and M24 are expressed as the following equations (7-1), (7-2), (7-3) and (7-4), respectively.

$$I_{D21} = I[1 + \gamma x^2 + (\alpha/2) \times (1 - \beta x^2)^{1/2}] \tag{7-1}$$

$$I_{D22} = I[1 + \gamma x^2 + (\alpha/2) \times (1 - \beta x^2)^{1/2}] \tag{7-1}$$

$$I_{D23} = I[n - \gamma x^2 + (\alpha/2) \times (1 - \beta x^2)^{1/2}] \tag{7-3}$$

$$I_{D24} = I[n - \gamma x^2 + (\alpha/2) \times (1 - \beta x^2)^{1/2}] \tag{7-4}$$

In the equations (7-1), (7-2), (7-3) and (7-4), $\alpha$, $\beta$ and $\gamma$ are defined as the following expressions (8-1), (8-2) and (8-3), respectively.

$$\alpha = 4n/(n+1) \tag{8-1}$$

$$\beta = n/(n+1)^2 \tag{8-2}$$

$$\gamma = n(n-1)/(n+1)^2 \tag{8-3}$$

The drain current $I_{D21}$, $I_{D22}$, $I_{D23}$ and $I_{D24}$ and the constant currents (n+1)I of the current sources 61 and 62 satisfy the following relationship as $$I_{D21} + I_{24} = I_{D22} + I_{D23} = (n+1)I \tag{9}$$

Accordingly, the sum $(I_{D21} + I_{D22})$ of the drain currents $I_{D21}$ and $I_{D22}$ can be expressed as the following equation (10) and the drain currents $I_{D25}$ of the transistor M25 can be expressed as the following equation (11).

$$I_{D21} + I_{D22} = 2I[1 + \gamma x^2] = 2I + \{2n(n-1)/(n+1)^2\}Ix^2 \tag{10}$$

$$I_{D25} = aI - (I_{D21} + I_{D22}) \tag{11}$$

Here, the current of the balanced differential pair of the transistors M26 and M27 is defined as $I_0$, then the output current is expressed as the following equation (12).

$$i = I_{D6} - I_{D7} = k'V\{2I_0/k' - v^2\}^{1/2} \quad (|v| \leq (I_0/k')^{1/2}) \tag{12}$$

The current $I_0$ satisfies the relationship as $$\begin{aligned} I_0 &= aI - I_{D5} = I_{D1} + I_{D2} \\ &= 2I + [\{2Kn(n-1)\}/(n+1)^2]v^2 \end{aligned} \tag{13}$$

Thus, if the equation (13) is substituted into the equation (12), the output current i can be expressed as $$i = k'v\sqrt{\frac{4I}{k'} + \left\{\frac{2n(n-1)k_0}{(n+1)^2 k'} - 1\right\}v^2} \tag{14}$$

If the relationship between $k_0$ and $k'$ is selected as the following expression (15), the output current i is obtained as the following equation (16).

$$k' = \{2n(n-1)/(n+1)^2\}k_0 \tag{15}$$

$$\begin{aligned} i &= 2v\sqrt{Ik'} \\ &= \frac{2\sqrt{2n(n-1)Ik_0}}{n+1}v \end{aligned} \tag{16}$$

It is seen from the equation (16) that the differential amplifier circuit shown in FIG. 3 has a very good transconductance linearity.

FIG. 4 shows still another example of the conventional differential amplifier circuits to be formed on bipolar integrated circuits, which is disclosed by M. Koyama, H. Tanimoto and S. Mizoguchi in IEEE 1989 Custom Integrated Circuits Conference, pp. 25.2.1–25.2.4, entitled "10.7 MHz Continuous-Time Bandpass filter Bipolar IC".

In FIG. 4, bipolar transistors Q11 and Q12 compose a first differential pair which is driven by a constant current source 71 (current: $I_0$). Emitters of the transistors Q11 and Q12 are connected in common to the current source 71. Bipolar transistors Q13 and Q14 compose a second differential pair which is driven by a constant current source 72 (current: $I_0$). Emitters of the transistors Q13 and Q14 are connected in common to the current source 72.

Collectors of the transistors Q11 and Q13 coupled together and collectors of the transistors Q12 and Q14 coupled together form differential output ends of the differential amplifier circuit. Bases of the transistors Q11 and Q12 form differential input ends of the differential amplifier circuit to be applied with an input voltage $V_{in}$.

A direct current (DC) voltage source 73 (Voltage: $V_k$) is provided between the bases of the transistors Q11 and Q13 and a DC voltage source 74 (Voltage: $V_k$) is provided between the bases of the transistors Q14 and Q12. Thus, bias voltages $V_k$ are respectively applied to the bases of the transistors Q12 and Q13 with their negative ends at the bases of the transistors Q11 and Q14.

An electric current (emitter current) $I_E$ of a p-n junction diode forming a bipolar transistor can be expressed by the following equation (17), where $I_g$ is the saturation current, $k_B$ is Boltzmann's constant, q is the unit electron charge, $V_{BE}$ is a base-to-emitter voltage of the transistor and T is absolute temperature.

$$I_g = I_S [\exp\{(qV_{BE})/(k_BT)\} - 1] \qquad (17)$$

Here, if the thermal voltage $V_T$ is defined as $V_T = kT/q$, as $V_{BE} \gg V_T$, when $\exp(V_{BE}/V_T) \gg 1$ in the equation (17), the emitter current $I_E$ can be approximated as follows;

$$I_E \approx I_S \exp(V_{BE}/V_T) \qquad (18)$$

As a result, collector currents $I_{C11}$ and $I_{C12}$ of the transistors Q11 and Q12 can be obtained as follows:
Base-to-emitter voltages of the transistors Q11 and Q12 are expressed as $$V_{BE11} = V_T \ln(I_{C11}/I_S) \qquad (19\text{-}1)$$

and $$V_{BE12} = V_T \ln(I_{C12}/I_S) \qquad (19\text{-}2)$$

Here, the difference between the voltages $V_{BE11}$ and $V_{BE12}$ is defined as $V_1$, or $V_{BE11} - V_{BE12} = V_1$. Then, the sum of the collector currents $I_{C11}$ and $I_{C12}$ is expressed as $I_{C11} + I_{C12} = \alpha_F I_E$ where $\alpha_F$ is the DC common-base current gain factor. Therefore, the collector currents $I_{C11}$ and $I_{C12}$ can be given as the following equations (20-1) and (20-2), respectively.

$$I_{C11} = (\alpha_F I_0)/\{1 + \exp(-V_1/V_T)\} \qquad (20\text{-}1)$$

$$I_{C12} = (\alpha_F I_0)/\{1 + \exp(V_1/V_T)\} \qquad (20\text{-}2)$$

From the equations (20-1) and (20-2), the difference $\Delta I_1$ between the collector currents $I_{C11}$ and $I_{C12}$ is given as $$\Delta I_1 = I_{C11} - I_{C12} = \alpha_F I_0 \tan h\{V_1/(2V_T)\} \qquad (21)$$

The transconductance $G_{m1}$ is expressed by differentiating the difference $\Delta I_1$ by the voltage $V_1$ as the following equation (22).

$$G_{m1} = d(\Delta I_1)/dv_1 = \{(\alpha_F I_0)/(2V_T)\}[1/\}\cos h^2(V_1/(2V_T))\}] \qquad (22)$$

In the equation (22), the difference $V_1$ between the base-to-emitter voltages $V_{BE11}$ and $V_{BE12}$ is defined as $V_1 = V_{in} - V_k$ where $V_k$ is the offset bias voltage described above.

With the second differential pair of the transistors Q13 and Q14, similarly, the difference $\Delta I_2$ between the collector currents $I_{C13}$ and $I_{C14}$ of the transistors Q13 and Q14 can be expressed as the following equation (23).

$$\Delta I_2 = I_{C13} - I_{C14} = \alpha_F I_0 \tan h\{V_2/(2V_T)\} \qquad (23)$$

In the equation (23), the difference $V_2$ between the base-to-emitter voltages $V_{BE13}$ and $V_{BE14}$ is defined as $V_2 = V_{in} - V_k$, so that the sum $\Delta I$ of the current differences $\Delta I_1$ and $\Delta I_2$ can be given by the following equation (24).

$$\begin{aligned}\Delta I &= \Delta I_1 + \Delta I_2 \\ &= \alpha_F I_0 [\tanh\{(v_{in} - v_k)/(2v_T)\} + \\ &\quad \tanh\{(v_{in} + v_K)/(2v_T)\}]\end{aligned} \qquad (24)$$

The sum $G_m$ of the transconductances $G_{m1}$ and $G_{m2}$ of the first and second differential pairs can be given by the following equation (25).

$$\begin{aligned}G_m &= G_{n1} + G_{n2} \\ &= d(\Delta I_1)/dv_{in} + d(\Delta I_2)/dv_{in} \\ &= \{(\alpha_F I_0)/(2v_T)\} \times \\ &\quad [[1/\cosh^3\{(v_{in} - v_k)/(2v_T)\}] + \\ &\quad [1/\cosh^2\{(v_{in} + v_k)/(2v_T)\}]]\end{aligned} \qquad (25)$$

The transconductance $G_{m1}$ in the equation (22) shows the maximally flat characteristic when $V_K = 1.3137 \, V_T$. FIG. 5 shows the transconductance characteristics of the differential amplifier circuit. It is seen from FIG. 5 that the fluctuation of the transconductance is limited to $-1\%$ or less when $|V_{in}| \leq V_T$.

The conventional differential amplifier circuits described above have the following problems. With the differential amplifier circuit shown in FIG. 1, since the circuit has the transconductance fluctuation about 3%, it cannot be employed to applications requiring the fluctuation less than 3%, which means that application fields of the circuit is narrow. In addition, since the differential output current is expressed as the difference between the drain current difference, the current efficiency with respect to the driving currents is low.

With the conventional differential amplifier circuit shown in FIG. 3, the differential pair composing the squaring circuit is realized by an MOS transistor with the transconductance parameter $k_0$ and n in number of the MOS transistors with the transconductance parameter $k_0$ which are connected in parallel. Therefore, the chip occupation area is expanded and the current consumption increases due to a large number of elements.

For example, choosing $k' = k_0/2$ in the equation (15), we get $n = 1 + 2/3^{1/2} \approx 2.155$. Therefore, to obtain a very good transconductance linearity, each of the unbalanced differential pairs must be composed of 431 in number of unit transistors and 200 in number of the unit transistors, which requires a very large chip occupation area. Thus, the conventional differential amplifier circuit shown in FIG. 3 is not practical.

With the differential amplifier circuit shown in FIG. 4, the input voltage range is not wide to be satisfied.

SUMMARY OF THE INVENTION

Accordingly, an object of the present invention is to provide a differential amplifier circuit in which an improved transconductance linearity can be obtained and its circuit configuration is simple without enlarging its circuit scale.

Another object of the present invention is to provide a differential amplifier circuit in which the current efficiency can be improved.

Still another object of the present invention is to provide a differential amplifier circuit which has a substantially linear transconductance in a wider range than the conventional one.

A differential amplifier circuit according to a first aspect of the present invention includes a first differential pair formed of first and second transistors, a second differential pair formed of third and fourth transistors, a third differential pair formed of fifth and sixth transistors and a fourth differential pair formed of seventh and eighth transistors.

A ratio (W/L) of a gate-width W and a gate-length L of the second transistor is $K_1$ times as much as that of the first transistor where $K_1 \neq 1$, a ratio (W/L) of the third transistor is $K_2$ times as much as that of the fourth transistor where $K_2 \neq 1$, a ratio (W/L) of the sixth transistor is $K_3$ times as much as that of the fifth transistor where $K_3 \neq 1$, and a ratio (W/L) of the seventh transistor is $K_4$ times as much as that of the eighth transistor where $K_4 \neq 1$.

Gates of the first and third transistors and gates of the fifth and seventh transistors are coupled together to form one of differential input ends, and gates of the second and fourth transistors and gates of the sixth and eighth transistors are coupled together to form the other of the differential input ends.

Drains of the first and fourth transistors and drains of the sixth and seventh transistors are coupled together to form one of differential output ends, and drains of the second and third transistors and drains of the fifth and eighth transistors are coupled together to form the other of the differential output ends.

Additionally, the differential amplifier circuit of the first aspect satisfies one of the following conditions (a), (b) and (c).

(a) At least one of the ratios (W/L) of the fifth and eighth transistors is different from at least one of the ratios (W/L) of the first and fourth transistors.

(b) At least one of $K_3$ and $K_4$ of the third and fourth differential pairs is different from at least one of $K_1$ and $K_2$ of the first and second differential pairs.

(c) Current values of the first and second constant current sources are different from those of the third and fourth constant current sources.

With the differential amplifier circuit of the first aspect, there are provided with the first, second, third and fourth "unbalanced" differential pairs whose ratios (W/L) are each different from each other. The drains of the first and fourth transistors whose relative ratios of (W/L) are 1 and the drains of the sixth and seventh transistors whose relative ratios of (W/L) is $K_3$ and $K_4$ are coupled together to form one of the differential output ends. The drains of the second and third transistors whose relative ratio of (W/L) is $K_1$ and $K_2$ and the drains of the fifth and eighth transistors whose relative ratios of (W/L) are 1 are coupled together to form the other of the differential output ends.

Therefore, the transconductance linearity of the differential amplifier circuit can be improved as well as the current efficiency thereof can be increased.

A differential amplifier circuit according to a second aspect of the present invention includes a first differential pair of first and second transistors, a second differential pair of third and fourth transistors and a third differential pair of fifth and sixth transistors.

The first and second differential pairs are driven by constant currents whose values are equal to each other, and the third differential pair is driven by a constant current whose value is different from those of the first and second differential pairs. The transistors forming each differential pair have the same ratios (W/L) with each other.

Gates of the first and third transistors coupled together and gates of the second and fourth transistors coupled together form differential input ends. Drains of the first, third and sixth transistors coupled together and drains of the second, fourth and fifth transistors coupled together form differential output ends.

A first DC voltage is applied across the gates of the first and third transistors and a second DC voltage is applied across the gates of the second and fourth transistors.

With the differential amplifier circuit of the second aspect, there are provided with the first and second "balance" differential pairs whose ratios (W/L) are each equal to each other, which are driven by the currents having the same current values. There is provided with the third "balanced" differential pair driven by the current different in current value from the first and second differential pairs. The output ends of the first and second differential pairs are cross-coupled. An input voltage is directly applied across the differential input ends of the third differential pair, and the input voltage is applied across the differential input ends of the first and second differential pairs together with the first and second DC voltages as offset bias voltages.

Therefore, higher current efficiency than that of the first aspect can be realized together with the similar transconductance linearity to that of the prior art.

A differential amplifier circuit according to a third aspect of the present invention includes a first differential pair of first and second transistors driven by a first constant current source, and a second differential pair of third and fourth transistors driven by a second constant current source whose current value is equal to that of the first constant current source.

A ratio (W/L) of the second transistor is K times as much as that of the first transistor where $K \neq 1$, a ratio (W/L) of the fourth transistor is K times as much as that of the third transistor. The relative ratio K is 9.5.

Gates of the first and fourth transistors coupled together and gates of the second and third transistors coupled together form differential input ends. Drains of the first and third transistors coupled together and drains of the second and fourth transistors coupled together form differential output ends.

Preferably, the gate-lengths of the first and third transistors are equal to each other.

With the differential amplifier circuit of the third aspect, there are provided with the first and second "unbalanced" differential pairs whose ratios (W/L) are each different from each other. The Drains of the first and third transistors whose relative ratios are 1 are coupled together and the drains of the second and fourth transistors whose relative ratios are K (=9.5) are coupled together to form the differential output ends. The gates of the first and fourth transistors whose relative ratios are 1 and K (=9.5) are coupled together and the gates of the second and third transistors whose relative ratios are K (=9.5) and 1 are coupled together to form the differential input ends.

Accordingly, the size of the transistor having the larger ratio (W/L) of each differential pair can be restricted to several times as much as that of the transistor having the smaller ratio (W/L) thereof. As a result, the circuit scale can be reduced.

A transconductance with comparatively good linearity can be obtained in a wider input voltage range.

A differential amplifier circuit according to a fourth aspect of the present invention includes a first differential pair of first and second transistors, a second differential pair of third and fourth transistors and a third differential pair of fifth and sixth transistors.

Bases of the first and fifth transistors coupled together and bases of the fourth and sixth transistors coupled together form differential input ends. Collectors of the first, third and fifth transistors coupled together and drains of the second, fourth and sixth transistors coupled together form differential output ends.

A first DC voltage is applied across the bases of the first and third transistors and a second DC voltage is applied across the bases of the second and fourth transistors.

With the differential amplifier circuit of the fourth aspect, the input voltage is applied across the input ends of the first differential pair together with the second DC voltages as an offset bias voltage, the input voltage is applied across the input ends of the second differential pair together with the first DC voltages as an offset bias voltage, and the input voltage is applied directly across the input ends of the third differential pair.

Therefore, an improved transconductance linearity can be obtained and as a result, the input voltage range can be expanded.

Additionally, improved high-frequency characteristics can be given since each differential pair is formed of two minimum unit transistors.

A differential amplifier circuit according to a fifth aspect of the present invention includes a first differential pair of first and second transistors, a second differential pair of third and fourth transistors, a third differential pair of fifth and sixth transistors, and a fourth differential pair of seventh and eighth transistors.

Bases of the first and fifth transistors coupled together and bases of the fourth and eighth transistors coupled together form differential input ends. Collectors of the first, third, fifth and seventh transistors coupled together and collectors of the second, fourth, sixth and eighth transistors coupled together form differential output ends.

A first DC voltage is applied across the bases of the first and third transistors, a second DC voltage is applied across the bases of said second and fourth transistors, a third DC voltage is applied across the bases of the fifth and seventh transistors, and a fourth DC voltage is applied across the bases of the sixth and eighth transistors.

With the differential amplifier circuit of the fifth aspect, the input voltage is applied across the input ends of the first differential pair together with the second DC voltages as an offset bias voltage, the input voltage is applied across the input ends of the second differential pair together with the first DC voltages as an offset bias voltage, the input voltage is applied across the input ends of the third differential pair together with the fourth DC voltages as an offset bias voltage, and the input voltage is applied across the input ends of the fourth differential pair together with the third DC voltages as an offset bias voltage.

Therefore, similar to the circuit of the fourth aspect, an improved transconductance linearity can be obtained and as a result, the input voltage range can be expanded.

Additionally, improved high-frequency characteristics can be given since each differential pair is formed of two minimum unit transistors.

DETAILED DESCRIPTION OF THE PREFERRED EMBODIMENTS

Preferred embodiments of the present invention will be described below referring to FIGS. 6 to 18.

Figure 6:
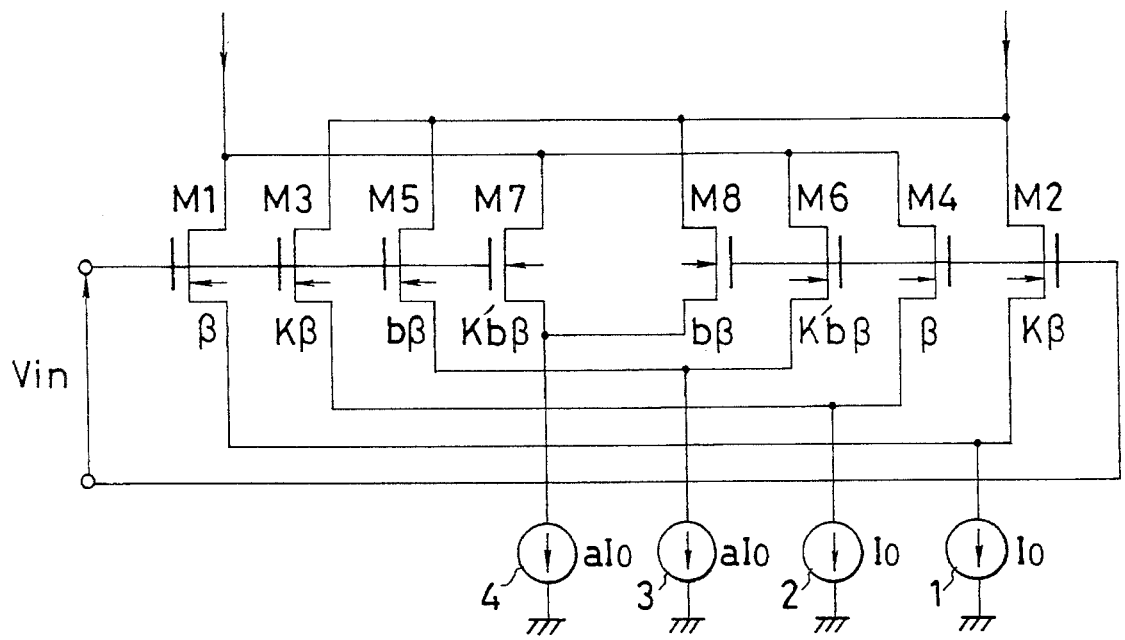
FIG. 6 is a circuit diagram of a differential amplifier circuit according to a first embodiment of the present invention.

FIG. 6 shows a differential amplifier circuit of a first embodiment.

In FIG. 6, N-channel MOS transistors M1 and M2 compose a first differential pair which is driven by a constant current source 1 whose current value is $I_0$. N-channel MOS transistors M3 and M4 compose a second differential pair which is driven by a constant current source 2 whose current value is $I_0$. The first and second differential pairs form a first combined differential pair.

N-channel MOS transistors M5 and M6 compose a third differential pair which is driven by a constant current source 3 whose current value is $aI_0$ where $a \neq 1$. N-channel MOS transistors M7 and M8 compose a fourth differential pair which is driven by a constant current source 4 whose current value is $aI_0$. The third and fourth differential pairs form a second combined differential pair.

In the first combined differential pair, a ratio (W/L) of a gate-width W and a gate-length L of the transistor M2 is K times as much as that of the transistor M1 where $K \neq 1$. A ratio (W/L) of the transistor M3 is K times as much as that of the transistor M4. The ratios (W/L) of the transistors M1 and M4 are equal to each other.

Gates of the transistor M1 whose relative ratio is 1 and the transistor M3 whose relative ratio is K are coupled together and gates of the transistor M4 whose relative ratio is 1 and the transistor M2 whose relative ratio is K are coupled together. Drains of the transistors M1 and M4 whose relative ratios are 1 are coupled together and drains of the transistors M2 and M3 whose relative ratios are K are coupled together.

In the second combined differential pair, a ratio (W/L) of a gate-width W and a gate-length L of the transistor M6 is K' times as much as that of the transistor M5 where $K' \neq 1$. A ratio (W/L) of the transistor M7 is K' times as much as that of the transistor M8. The ratios (W/L) of the transistors M5 and M8 are equal to each other.

The ratios (W/L) of the transistor M5 and M8 are b times as much as those of the transistors M1 and M4 where $b' \neq 1$. Therefore, the ratios (W/L) of the transistors M6 and M7 are K'b times as much as those of the transistors M1 and M4.

Gates of the transistor M5 whose relative ratio is 1 and the transistor M7 whose relative ratio is K' are coupled together and gates of the transistor M8 whose relative ratio is 1 and the transistor M6 whose relative ratio is K' are coupled together. Drains of the transistors M5 and M8 whose relative ratios are 1 are coupled together and drains of the transistors M6 and M7 whose relative ratios are K' are coupled together.

The gates coupled of the transistors M1 and M3 and the gates coupled of the transistors M5 and M7 are coupled together to form one of differential input ends. The gates coupled of the transistors M2 and M4 and the gates coupled of the transistors M6 and M8 are coupled together to form the other of the differential input ends. An input voltage $V_{in}$ is applied across the differential input ends thus formed.

The drains coupled of the transistors M1 and M4 and the drains coupled of the transistors M6 and M7 are coupled together to form one of differential output ends. The drains coupled of the transistors M2 and M3 and the drains coupled of the transistors M5 and M8 are coupled together to form the other of the differential output ends.

In FIG. 6, $\beta$ indicates the transconductance parameters of the transistors M1 and M4. The transistors M1 to M8 have the transconductance parameters as shown in FIG. 6, respectively.

Next, the operation of the differential amplifier circuit is shown below.

In the first combined differential pair formed of the transistors M1 to M4, when gate-to-source voltages of the transistors M1, M2, M3 and M4 are expressed as $V_{GS1}$, $V_{GS2}$, $V_{GS3}$ and $V_{GS4}$ respectively, the threshold voltages of the transistors are as $V_{TH}$, drain currents $Id_{d1}$, $I_{d2}$, $I_{d3}$ and $I_{d4}$ of the transistors M1, M2, M3 and M4 can be expressed as the following equations (26-1), (26-2), (26-3) and (26-4), respectively.

$$I_{d1} = \beta(V_{GS1} - V_{TH})^2 \tag{26-1}$$

$$I_{d2} = K\beta(V_{GS2} - V_{TH})^2 \tag{26-2}$$

$$I_{d3} = K\beta(V_{GS3} - V_{TH})^2 \tag{26-3}$$

$$I_{d4} = \beta(V_{GS4} - V_{TH})^2 \tag{26-4}$$

The drain currents $Id_{d1}$, $I_{d2}$, $I_{d3}$ and $I_{d4}$ and the constant currents $I_0$ of the current sources 1 and 2 have the following relationship (27) and the gate-to-source voltages $V_{GS1}$, $V_{GS2}$, $V_{GS3}$ and $V_{GS4}$ and the input voltage $V_{in}$ have the following relationship (28).

$$I_{d1} + I_{d2} = I_{d3} + I_{d4} = I_0 \tag{27}$$

$$V_{GE1} - V_{GE2} = V_{GS4} - V_{GS3} = V_{in} \tag{28}$$

Therefore, the difference of the drain currents $Id_{d1}$ and $I_{d2}$ are given as the following expressions (29-1), (29-2) and (29-3), and the difference of the drain currents $Id_{d3}$ and $I_{d4}$ are given as the following expressions (30-1), (30-2) and (30-3).

$$I_{d1} - I_{d2} = \frac{\{1 - (1/K)\}\{[1 + (1/K)]I_0 - 2\beta V_{in}^2\}}{\{1 + (1/K)\}^2} + \frac{\beta V_{in}(4/\sqrt{K})\sqrt{\{1 + (1/K)\}(I_0/\beta) - V_{in}^2}}{\{1 + (1/K)\}^2} \tag{29-1}$$

$$(-\sqrt{I_0/\beta} \leq V_{in} \leq \sqrt{I_0/(K\beta)})$$

$$I_{d1} - I_{d2} = I_0 \quad (V_{in} \geq \sqrt{I_0/(K\beta)}) \tag{29-2}$$

$$I_{d1} - I_{d2} = -I_0 \quad (V_{in} \leq -\sqrt{I_0/\beta}) \tag{29-3}$$

$$I_{d3} - I_{d4} = \frac{\{1 - (1/K)\}\{[1 + (1/K)]I_0 - 2\beta V_{in}^2\}}{\{1 + (1/K)\}^2} + \frac{\beta V_{in}(4/\sqrt{K})\sqrt{\{1 + (1/K)\}(I_0/\beta) - V_{in}^2}}{\{1 + (1/K)\}^2} \tag{30-1}$$

$$(-\sqrt{I_0/(K\beta)} \leq V_{in} \leq \sqrt{I_0/\beta})$$

$$I_{d3} - I_{d4} = I_0 \quad (V_{in} \geq \sqrt{I_0/\beta}) \tag{30-2}$$

$$I_{d3} - I_{d4} = -I_0 \quad (V_{in} \leq -\sqrt{I_0/(K\beta)}) \tag{30-3}$$

Accordingly, the differential output current $\Delta I_1$ of the first combined differential pair is given as the following expressions (31-1), (31-2) and (31-3).

$$\begin{aligned}\Delta I_1 &= (I_{d1} + I_{d3}) - (I_{d2} + I_{d4}) \\ &= (I_{d1} - I_{d2}) + (I_{d3} - I_{d4}) \\ &= \frac{(8/\sqrt{K})\beta V_{in}\sqrt{\{1 + (1/K)\}(I_0/\beta) - V_{in}^2}}{\{1 + (1/K)\}^2}\end{aligned} \tag{31-1}$$

$$(|V_{in}| \leq \sqrt{I_0/(K\beta)})$$

$$I_1 = (4/\sqrt{K})\beta V_{in} \frac{\sqrt{\{1+(1/K)\}(I_0/\beta) - V_{in}^2}}{\{1+(1/K)\}^2} + \quad (31\text{-}2)$$

$$\frac{2\{1-(1/K)\}\beta V_{in}^2}{\{1+(1/K)\}^2} \text{sgn}(V_{in}) +$$

$$\frac{2(1/K)}{1+(1/K)} I_0 \text{sgn}(V_{in})$$

$$(\sqrt{I_0/(K\beta)} \le |V_{in}| \le \sqrt{I_0/\beta})$$

$$\Delta I_1 = 2I_0 \text{sgn}(V_{in}) \quad (|V_{in}| \ge \sqrt{I_0/\beta}) \quad (31\text{-}3)$$

Differentiating the differential output current $\Delta I_1$ in the expressions (31-1), (31-2) and (31-3) by the input voltage $V_{in}$ leads the transconductance as shown in the following expressions (32-1), (32-2) and (32-3).

$$\frac{d(\Delta I_1)}{dV_{in}} = \quad (32\text{-}1)$$

$$\frac{8K\sqrt{\beta I_0}}{(K+1)\sqrt{1+K}} \left[ \sqrt{1 - [V_{in}^2/\{(1+(1/K))(I_0/\beta)\}]} - \frac{V_{in}^2/[\{1+(1/K)\}(I_0/\beta)]}{\sqrt{1+[V_{in}^2/[\{1+(1/K)\}(I_0/\beta)]}} \right] \quad (|V_{in}| \le \sqrt{I_0/(K\beta)})$$

$$\frac{d(\Delta I_1)}{dV_{in}} = \quad (32\text{-}2)$$

$$\frac{4K\sqrt{\beta I_0}}{(K+1)\sqrt{1+K}} \left[ \sqrt{1 - [V_{in}^2/\{1+(1/K)\}(I_0/\beta)]} - \frac{V_{in}^2/[\{1+(1/K)\}(I_0/\beta)]}{\sqrt{1+V_{in}^2/[\{1+(1/K)\}(I_0/\beta)]}} \right] + \frac{4\{1-(1/K)\}\beta V_{in}}{\{1+(1/K)\}^2}$$

$$(\sqrt{I_0/(K\beta)} \le |V_{in}| \le \sqrt{I_0/\beta})$$

$$\frac{d(\Delta I_1)}{dV_{in}} = 0 \quad (|V_{in}| \ge \sqrt{I_0/\beta}) \quad (32\text{-}3)$$

Similarly, in the second combined differential pair formed of the transistors M5 to M8, the differential output current $\Delta I_2$ of the second combined differential pair is given as the following expressions (33-1), (33-2) and (33-3) and the transconductance is given as the following expressions (34-1), (34-2) and (34-3).

$$\Delta I_2 = (I_{d5} - I_{d6}) + (I_{d7} - I_{d8}) \quad (33\text{-}1)$$

$$= \frac{(8/\sqrt{K'})b\beta V_{in}\sqrt{\{1+(1/K')\}(aI_0)/(b\beta)\} - V_{in}^2}}{\{1+(1/K')\}^2}$$

$$(|V_{in}| \le \sqrt{(aI_0)/(K'b\beta)})$$

$$\Delta I_2 = \frac{(4/\sqrt{K'})b\beta V_{in}\sqrt{\{1+(1/K')\}(aI_0)/(b\beta)\} - V_{in}^2}}{\{1+(1/K')\}^2} + \quad (33\text{-}2)$$

$$\frac{2\{1-(1/K')\}b\beta V_{in}^2}{\{1+(1/K')\}^2} \text{sng}(V_{in}) + \frac{2(1/K')}{\{1+(1/K')\}} I_0 \text{sgn}(V_{in})$$

$$(\sqrt{(aI_0)/(K'b\beta)} \le |V_{in}| \le \sqrt{(aI_0)/(b\beta)})$$

$$\Delta I_2 = 2aI_0 \text{sgn}(V_{in}) \quad (|V_{in}| \ge \sqrt{aI_0/(b\beta)}) \quad (33\text{-}3)$$

$$\frac{d(\Delta I_2)}{dV_{in}} = \quad (34\text{-}1)$$

$$\frac{8K'\sqrt{ab\beta I_0}}{(K'+1)\sqrt{1+K'}} \left[ \sqrt{1 - [V_{in}^2/[\{1+(1/K')\}(aI_0)/(b\beta)\}]]} - \frac{V_{in}^2/[\{1+(1/K')\}(aI_0)/(b\beta)\}]}{\sqrt{1+[V_{in}^2/[\{1+(1/K')\}(aI_0)/(b\beta)\}]}} \right]$$

$$(|V_{in}| \le \sqrt{(aI_0)/(Kb\beta)})$$

$$\frac{d(\Delta I_2)}{dV_{in}} = \quad (34\text{-}2)$$

$$\frac{4K'\sqrt{ab\beta I_0}}{(K'+1)\sqrt{1+K'}} \left[ \sqrt{1 - [V_{in}^2/[\{1+(1/K')\}(aI_0)/(b\beta)\}]]} - \frac{V_{in}^2/[\{1+(1/K')\}(aI_0)/(b\beta)\}]}{\sqrt{1+[V_{in}^2/[\{1+(1/K')\}(aI_0)/(b\beta)\}}} \right] +$$

$$\frac{4\{1-(1/K')\}b\beta V_{in}}{\{1+(1/K')\}^2} \quad (\sqrt{(aI_0)/(Kb\beta)} \le |V_{in}| \le \sqrt{(aI_0/(b\beta))})$$

$$\frac{d(\Delta I_2)}{dV_{in}} = 0 \quad (|V_{in}| \ge \sqrt{aI_0/(b\beta)}) \quad (34\text{-}3)$$

The differential output current $\Delta I$ of the differential amplifier circuit shown in FIG. 6 is given by $\Delta I = \Delta I_1 - \Delta I_2$, and its transconductance is given by $\{d(\Delta I)/dV_{in}\}$ as shown in the following expression (35).

$$d(\Delta I)/dV_{in} = \{d(\Delta I_1)/dV_{in}\} - \{d(\Delta I_2)/dV_{in}\} \quad (35)$$

Figure 7:
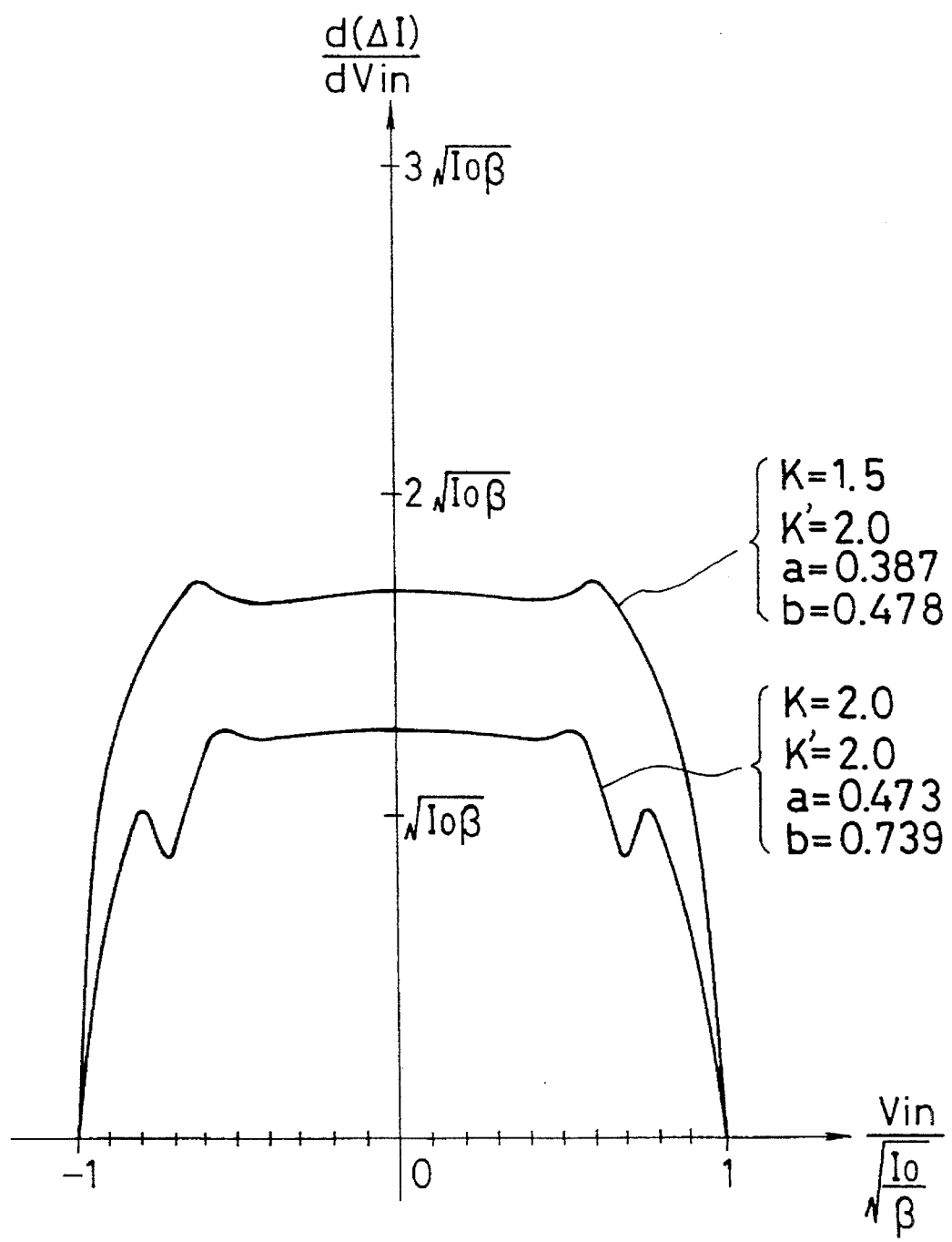
FIG. 7 shows a transconductance characteristic of the differential amplifier circuit shown in FIG. 6.

FIG. 7 shows the transconductance characteristics thus obtained in which K, K', a and b are used as parameters. It is seen from FIG. 7 that the transconductance curve shows a ripple at its each side when K=1.5, K'=2.0, a=0.387 and b=0.478 in the input voltage range of $0.7(I_0/\beta)^{1/2} \ge |V_{in}|$. It is also seen from FIG. 7 that the transconductance curve shows an about 1.6% ripple at its each side when K=2.0, K'=2.0, a=0.473 and b=0.739 in the input voltage range of $0.57(I_0/\beta)^{1/2} \ge |V_{in}|$.

Thus, the transconductance linearity of the differential amplifier circuit of the first embodiment can be drastically improved over the prior art.

In addition, it is seen from FIG. 7 that the current efficiency of the circuit can be increased.

With the second combined differential pair, in the first embodiment, the relative ratios of the transistors M5 and M6 and those of the transistors M7 and M8 are both K', their transconductance parameters are each b times as much as those of the first combined differential pair, and the current values of the constant current sources 3 and 4 are a times as much as those of the constant current sources 1 and 2. However, these values of K, K', a and b can be set appropriately to obtain various desired characteristics. For example, K' may be equal to K, or K'=K.

Figure 8:
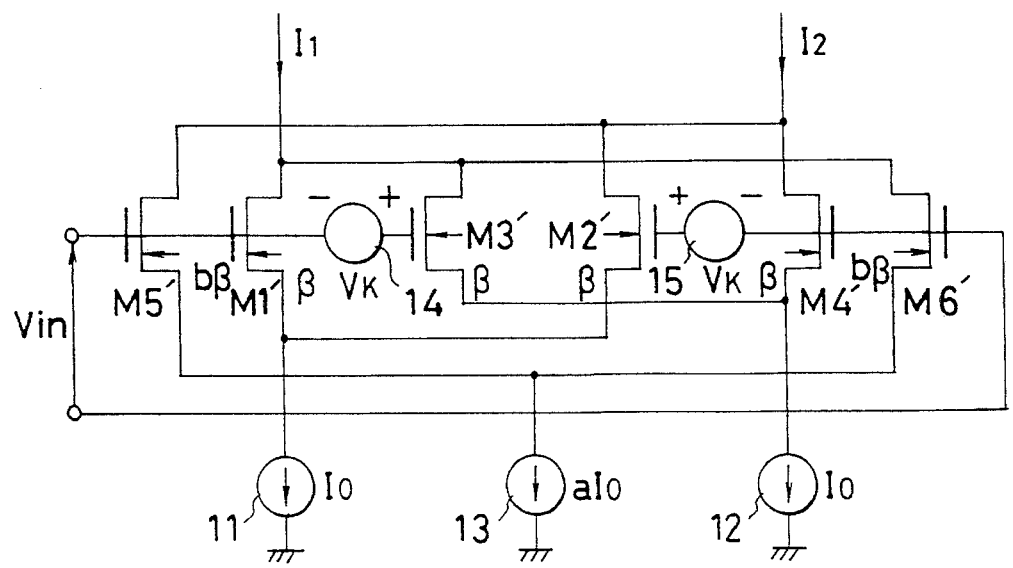
FIG. 8 is a circuit diagram of a differential amplifier circuit according to a second embodiment of the present invention.

FIG. 8 shows a differential amplifier circuit of a second embodiment.

In FIG. 8, N-channel MOS transistors M1' and M2' compose a first differential pair which is driven by a constant current source 11 whose current value is $I_0$. N-channel MOS transistors M3' and M4' compose a second differential pair which is driven by a constant current source 12 whose current value is $I_0$.

A ratio (W/L) of a gate-width W and a gate-length L of the transistor M1' is equal to that of the transistor M2', and a ratio (W/L) of the transistor M3' is equal to that of the transistor M4'.

N-channel MOS transistors M5' and M6' compose a third differential pair which is given by a constant current source 13 whose current value is $aI_0$ where $a \neq 1$. A ratio (W/L) of a gate-width W and a gate-length L of the transistor M5' is equal to that of the transistor M6' and is b times as much as that of the transistor M1' where $b \neq 1$.

As shown in FIG. 8, the transconductance parameters of the transistors M1' to M4' are equal to $\beta$, and those of the transistors M5' and M6' are b times as much as those of the transistors M1' to M4', or $b\beta$.

Gates of the transistors M1' and M5' are coupled together and gates of the transistors M4' and M6' are coupled together to form differential input ends. An input voltage $V_{in}$ is applied to the differential input ends thus formed.

Drains of the transistors M1', M3' and M6' are coupled together and drains of the transistors M2', M4' and M5' are coupled together to form differential output ends.

A first DC voltage $V_K$ is applied across the gates of the transistors M1' and M3' by a first DC voltage source 14, and a second DC voltage whose value is equal to that of the first DC voltage, or $V_K$, is applied across the gates of the transistors M2' and M4' by a second DC voltage source 15.

The polarity of the first DC voltage $V_K$ is made so that the voltage is high at the side of the transistor M3' and low at the side of the transistor M1'. The polarity of the second DC voltage $V_K$ is made so that the voltage is high at the side of the transistor M2' and low at the side of the transistor M4'.

Thus, in the first and second differential pairs, the DC voltages $V_K$ are applied as offset biases across the gates of the transistors M1' and M3' whose output ends are coupled together and the gates of the transistors M2' and M4' whose output ends are coupled together, respectively.

Next, the operation of the differential amplifier circuit is shown below.

The differential output current $\Delta I_1$ of the first differential pair is given as the following expressions (36-1), (36-2) and (36-3), the differential output current $\Delta I_2$ of the second differential pair is given as the following expressions (37-1), (37-2) and (37-3), and the differential output current $\Delta I_3$ of the third differential pair is given as the following expressions (38-1), (38-2) and (38-3).

$$\Delta I_1 = \beta(V_{in}+V_k)\sqrt{(2I_0/\beta)-(V_{in}+V_k)^2} \quad (36\text{-}1)$$
$$(|V_{in}+V_k| \leq \sqrt{I_0/\beta})$$

$$\Delta I_1 = I_0 \quad (V_{in}+V_k \geq \sqrt{I_0/\beta}) \quad (36\text{-}2)$$

$$\Delta I_1 = -I_0 \quad (V_{in}+V_k \leq -\sqrt{I_0/\beta}) \quad (36\text{-}3)$$

$$\Delta I_2 = \beta(V_{in}-V_k)\sqrt{(2I_0/\beta)-(V_{in}-V_k)^2} \quad (37\text{-}1)$$
$$(|V_{in}-V_k| \leq \sqrt{I_0/\beta})$$

$$\Delta I_2 = I_0 \quad (V_{in}-V_k \geq \sqrt{I_0/\beta}) \quad (37\text{-}2)$$

$$\Delta I_2 = -I_0 \quad (V_{in}-V_k \leq -\sqrt{I_0/\beta}) \quad (37\text{-}3)$$

$$\Delta I_3 = b\beta V_{in}\sqrt{(2aI_0)/(b\beta)-V_{in}^2} \quad (38\text{-}1)$$
$$(|V_{in}| \leq \sqrt{(aI_0)/(b\beta)})$$

$$\Delta I_3 = I_0 \quad (V_{in} \geq \sqrt{(aI_0)/(b\beta)}) \quad (38\text{-}2)$$

$$\Delta I_3 = -I_0 \quad (V_{in} \leq -\sqrt{(aI_0)/(b\beta)}) \quad (38\text{-}3)$$

The differential output current of the differential amplifier circuit shown in FIG. 8 is given as the following expression (39).

$$\Delta I = \Delta I_1 + \Delta I_2 - \Delta I_3 \quad (39)$$

Differentiation of the differential output current $\Delta I$ by the input voltage $V_{in}$ leads to the transconductance of the differential amplifier circuit as shown in the following expressions (40).

$$d(\Delta I)/dV_{in} = \{d(\Delta I_1)/dV_{in}\} + \{d(\Delta I_2)/dV_{in}\} - \{d(\Delta I_3)/dV_{in}\} \quad (40)$$

Figure 9:
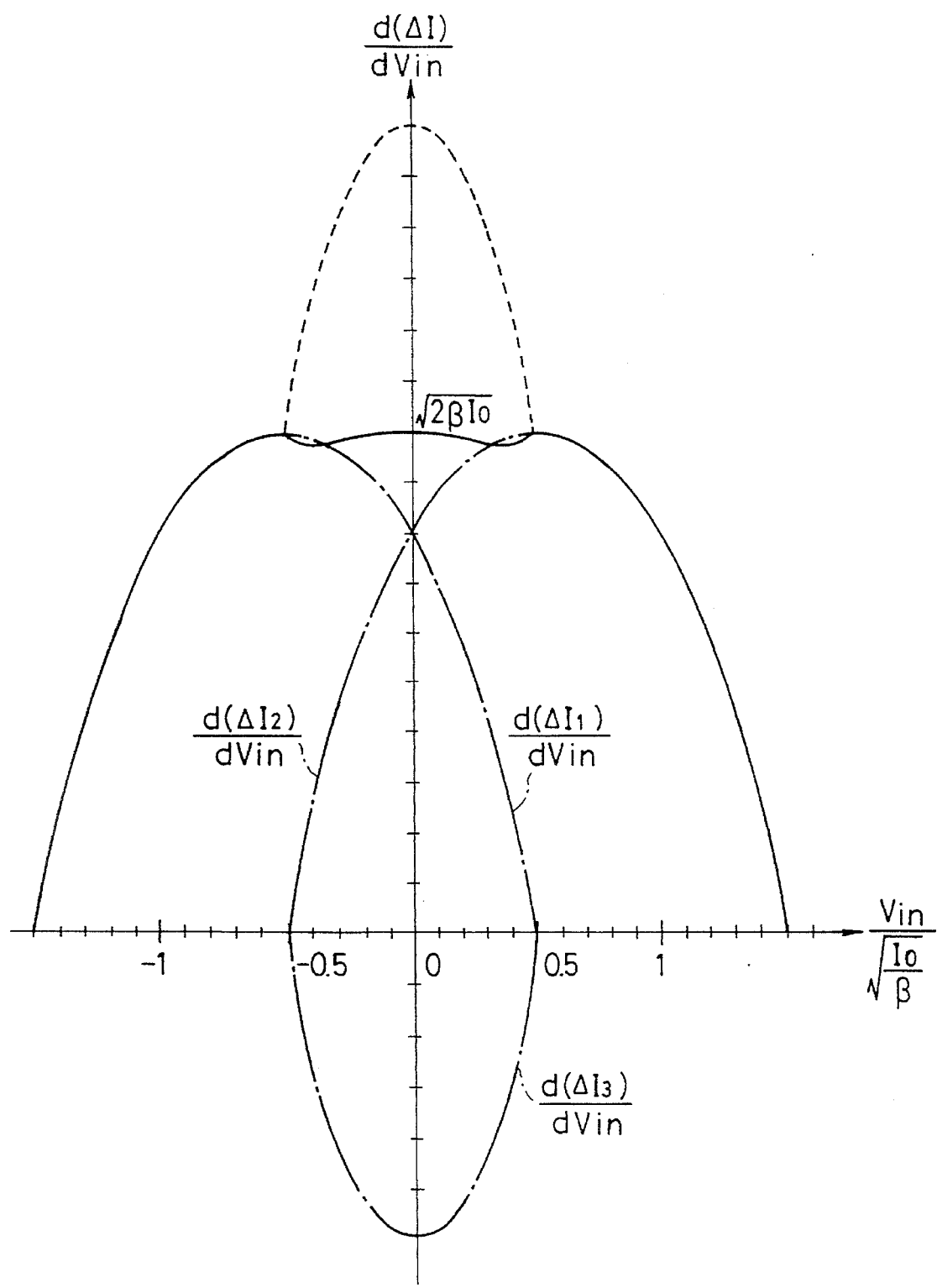
FIG. 9 shows a transconductance characteristic of the differential amplifier circuit shown in FIG. 8.

FIG. 9 shows the transconductance characteristics thus obtained in which $V_K = (½)(I_0/\beta)^{1/2}$ and $ab = 0.364333$. It is seen from FIG. 9 that the transconductance fluctuation is restricted to 3% or less in the input voltage range of $0.7(I_0/\beta)^{1/2} \geq |V_{in}|$, similar to the prior art.

Figure 1:
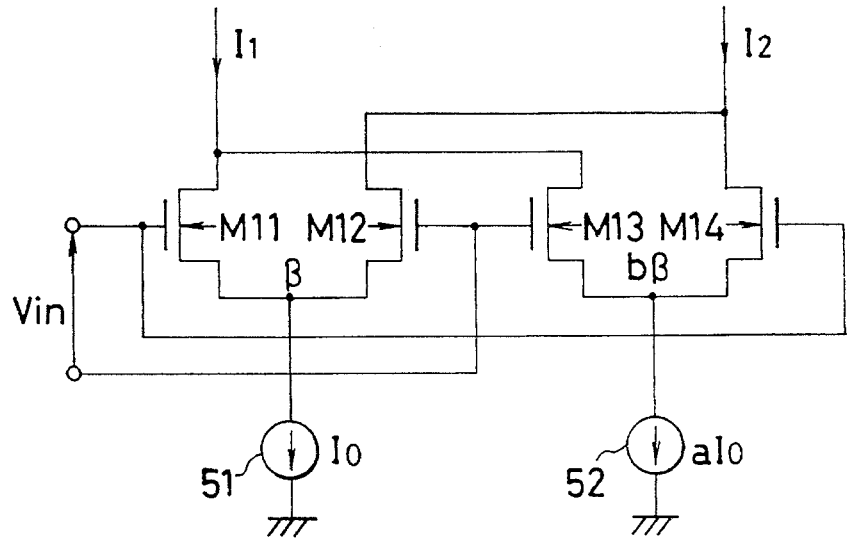
FIG. 1 is a circuit diagram of a conventional differential amplifier circuit.

The sum of the driving currents of the second embodiment is $(2+a)I_0$ which is larger than that of $(1+a)I_0$ of the prior-art differential amplifier circuit shown in FIG. 1. However, the differential output current of the second embodiment is $(2-a)I_0$ which is also larger than that of $(1-a)I_0$ of the circuit shown in FIG. 1. Therefore, the current efficiency of this embodiment is $\{(2-a)/(2+a)\}$ which is larger than that of $\{(1-a)/(1+a)\}$ of the circuit in FIG. 1.

For example, when $a=0.364$, $b=1$, the current efficiency of this embodiment is 0.692, and that of the prior-art circuit in FIG. 1 is 0.3423. This means that the current efficiency can be increased to about 2 times in current efficiency as much as the prior art in this embodiment.

As described above, the second embodiment has the higher current efficiency than the first embodiment together with the transconductance linearity similar to the prior art.

Figure 10:
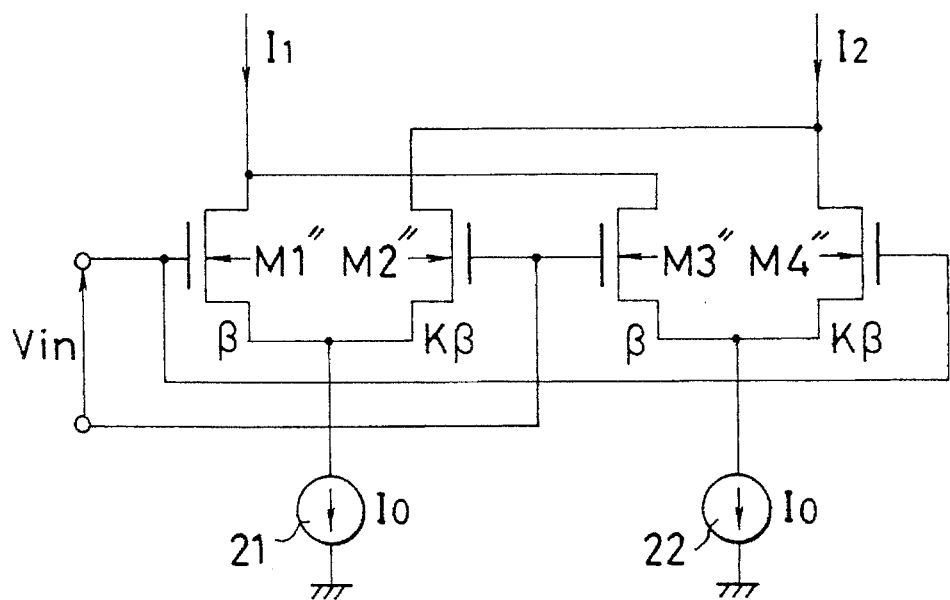
FIG. 10 is a circuit diagram of a differential amplifier circuit according to a third embodiment.

FIG. 10 shows a differential amplifier circuit of a third embodiment.

In FIG. 10, N-channel MOS transistors M1" and M2" compose a first differential pair which is driven by a constant current source 21 whose current value is $I_0$. A ratio (W/L) of a gate-width W and a gate-length L of the transistor M2" is K times as much as that of the transistor M1" where $K \neq 1$.

N-channel MOS transistors M3" and M4" compose a second differential pair which is driven by a constant current source 22 whose value is $I_0$. A ratio (W/L) of the transistor M4" is K times as much as that of the transistor M3".

As shown in FIG. 10, the transconductance parameters of the transistors M1" and M3" are equal to $\beta$, and those of the transistors M2" and M4" are $k\beta$.

Gates of the transistors M1" and M4" are coupled together and gages of the transistors M2" and M3" are coupled together to form differential input ends. An input voltage $V_{in}$ is applied to the differential input ends thus formed.

Drains of the transistors M1" and M3" are coupled together and drains of the transistors M2" and M4" are coupled together to form differential output ends.

In the embodiment, said relative ratio K is set to 9.5, which is based on the following reason.

When all the transistors M1" to M4" are operating in their saturation regions, drain currents $I_{d1}$, $I_{d2}$, $I_{d3}$ and $I_{d4}$ of these transistors are respectively expressed as the following equations (41-1), (41-2), (41-3) and (41-4), where $V_{GS1}$, $V_{GS2}$, $V_{GS3}$ and $V_{GS4}$ are gate-to-source voltages of these transistors, respectively and $V_{TH}$ is the threshold voltage thereof.

$$I_{d1} = \beta(V_{GS1} - V_{TH})^2 \quad (41\text{-}1)$$

$$I_{d2} = K\beta(V_{GS2} - V_{TH})^2 \quad (41\text{-}2)$$

$$I_{d3} = K\beta(V_{GS3} - V_{TH})^2 \quad (41\text{-}3)$$

$$I_{d4} = \beta(V_{GS4} - V_{TH})^2 \quad (41\text{-}4)$$

Here, $I_{d1} + I_{d2} = I_{d3} + I_{d4} = I_0$ and $V_{GS1} - V_{GS2} = V_{GS4} - V_{GS3} = V_{in}$ are established, so that the different $(I_{d1} - I_{d2})$ of the drain currents $I_{d1}$ and $I_{d2}$ is given as the following expressions (42-1), (42-2) and (42-3) and the difference $(I_{d3} - I_{d4})$ of the drain currents $I_{d3}$ and $I_{d4}$ is given as the following expressions (43-1), (43-2) and (43-3), respectively.

$$I_{d1} - I_{d2} = \frac{-\{1-(1/K)\}[\{1+(1/K)\}I_0 - 2\beta V_{in}^2]}{\{1+(1/K)\}^2} + \frac{\beta V_{in}(4/\sqrt{K})\sqrt{\{1+(1/K)\}(I_0/\beta) - V_{in}^2}}{\{1+(1/K)\}^2} \quad (42\text{-}1)$$

$$(-\sqrt{I_0/\beta} \leq V_{in} \leq \sqrt{I_0/(K\beta)})$$

$$I_{d1} - I_{d2} = I_0 \quad (V_{in} \geq \sqrt{I_0/(K\beta)}) \quad (42\text{-}2)$$

$$I_{d1} - I_{d2} = -I_0 \quad (V_{in} \leq -\sqrt{I_0/\beta}) \quad (42\text{-}3)$$

$$I_{d3} - I_{d4} = \frac{\{1-(1/K)\}[\{1+(1/K)\}I_0 - 2\beta V_{in}^2]}{\{1+(1/K)\}^2} + \frac{\beta V_{in}(4/\sqrt{K})\sqrt{\{1+(1/K)\}(I_0/\beta) - V_{in}^2}}{\{1+(1/K)\}^2} \quad (43\text{-}1)$$

$$(-\sqrt{I_0/(K\beta)} \leq V_{in} \leq \sqrt{I_0/\beta})$$

$$I_{d3} - I_{d4} = I_0 \quad (V_{in} \geq \sqrt{I_0/\beta}) \quad (43\text{-}2)$$

$$I_{d3} - I_{d4} = -I_0 \quad (V_{in} \leq -\sqrt{I_0/(K\beta)}) \quad (43\text{-}3)$$

Accordingly, the differential output current of the differential amplifier circuit $\Delta I$ is given as the following expressions (44-1), (44-2) and (44-3), respectively. Then, differentiation of the differential output current $\Delta I$ by the input voltage $V_{in}$ leads to the transconductance of the differential amplifier circuit as shown in the following expressions (45-1), (45-2) and (45-3), respectively.

$$\Delta I = (I_{d1} + I_{d3}) - (I_{d2} + I_{d4}) \quad (44\text{-}1)$$
$$= (I_{d1} - I_{d2}) + (I_{d3} - I_{d4})$$
$$= \frac{(8/\sqrt{K})\beta V_{in}\sqrt{\{1+(1/K)\}(I_0/\beta) - V_{in}^2}}{\{1+(1/K)\}^2}$$

$$(|V_{in}| \leq \sqrt{I_0/(K\beta)})$$

$$\Delta I = \frac{(4/\sqrt{K})\beta V_{in}\sqrt{\{1+(1/K)\}(I_0/\beta) - V_{in}^2}}{\{1+(1/K)\}^2} + \quad (44\text{-}2)$$
$$\frac{2\{1-(1/k)\}\beta V_{in}^2}{\{1+(1/K)\}^2} \text{sgn}(V_{in}) +$$
$$\frac{2(1/K)}{\{1+(1/K)\}} I_0 \text{sgn}(V_{in})$$

$$(\sqrt{I_0/(K\beta)} \leq |V_{in}| \leq \sqrt{I_0/\beta})$$

$$\Delta I = 2I_0 \text{sgn}(V_{in}) \quad (|V_{in}| \geq \sqrt{I_0/\beta}) \quad (44\text{-}3)$$

$$\frac{d(\Delta I_1)}{dV_{in}} = \quad (45\text{-}1)$$

$$\frac{8K\sqrt{\beta I_0}}{(K+1)\sqrt{1+K}} \left[ \sqrt{1 - [V_{in}^2/\{1+(1/K)\}(I_0/\beta)]} - \frac{V_{in}^2/[\{1+(1/K)\}(I_0/\beta)]}{\sqrt{1 + [V_{in}^2/\{1+(1/K)\}(I_0/\beta)]}} \right]$$

$$(|V_{in}| \leq \sqrt{I_0/(K\beta)})$$

$$\frac{d(\Delta I_1)}{dV_{in}} = \quad (45\text{-}2)$$

$$\frac{4K\sqrt{\beta I_0}}{(K+1)\sqrt{1+K}} \left[ \sqrt{1 - [V_{in}^2/\{1+(1/K)\}(I_0/\beta)]} - \frac{V_{in}^2/[\{1+(1/K)\}(I_0/\beta)]}{\sqrt{1 + [V_{in}^2/\{1+(1/K)\}(I_0/\beta)]}} \right] + \frac{4\{1-(1/K)\}\beta V_{in}}{\{1+(1/K)\}^2}$$

$$(\sqrt{I_0/(K\beta)} \leq |V_{in}| \leq \sqrt{I_0/\beta})$$

$$\frac{d(\Delta I_1)}{dV_{in}} = 0 \quad (|V_{in}| \geq \sqrt{I_0/\beta}) \quad (45\text{-}3)$$

When $K=9.5$ is set in the expressions (45-1), (45-2) and (45-3), the transconductance curve of this embodiment has a ripple at each side and the best linearity of the transconductance can be obtained.

Figure 3:
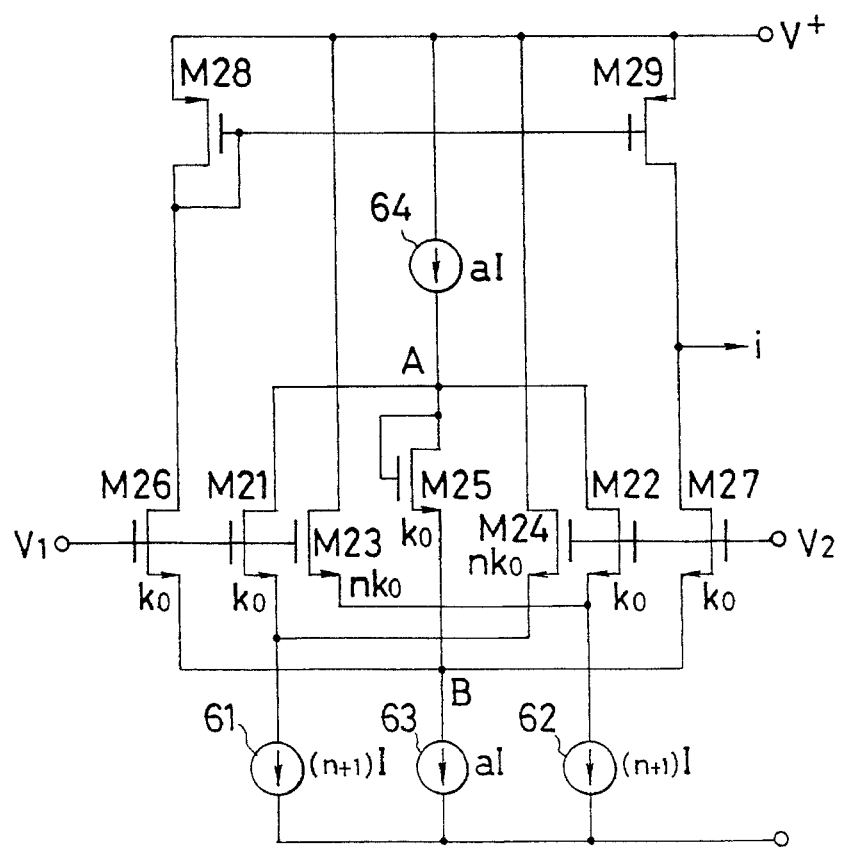
FIG. 3 is a circuit diagram of another conventional differential amplifier circuit.
Figure 2:
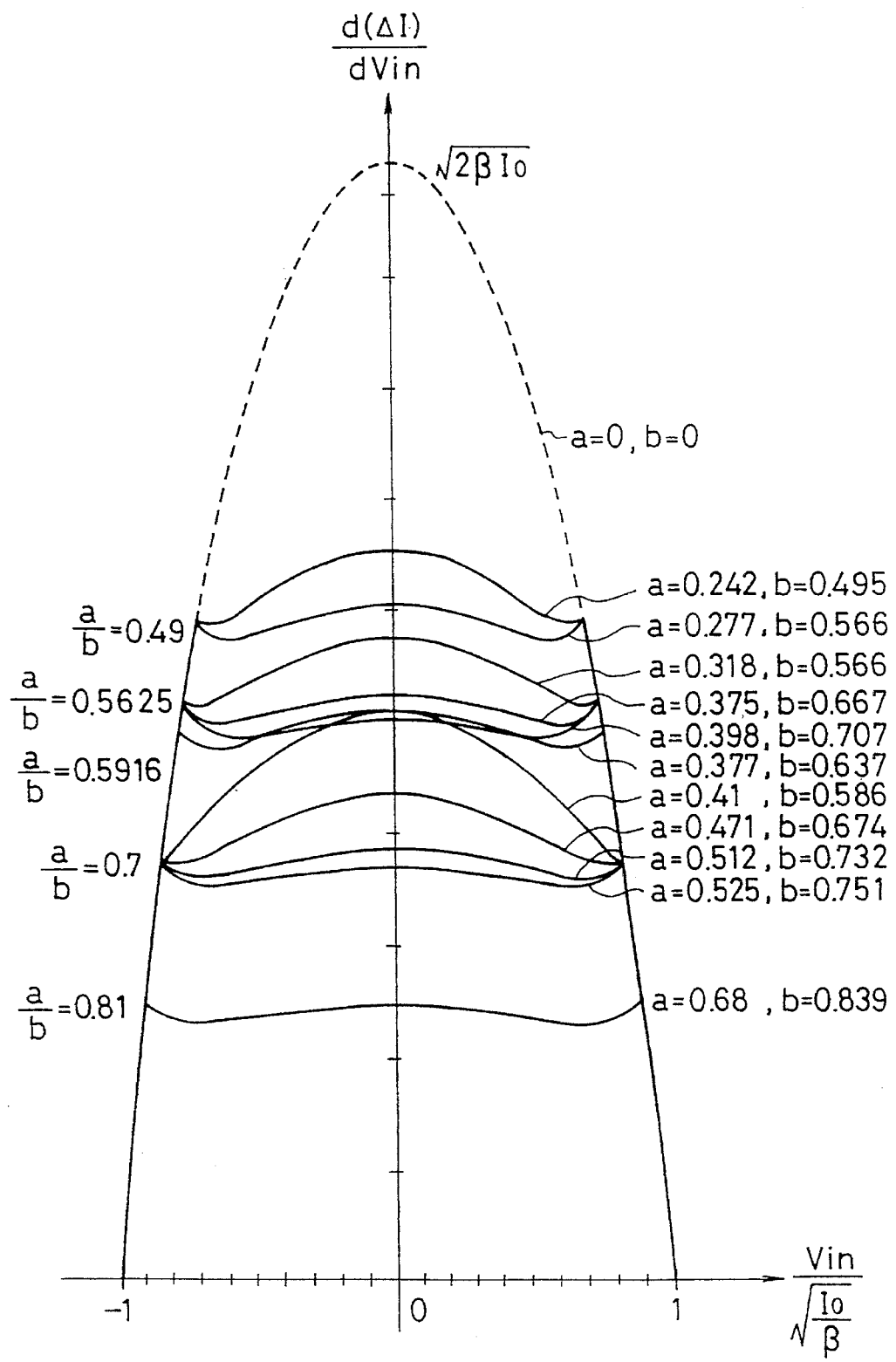
FIG. 2 shows a transconductance characteristic of the conventional differential amplifier circuit shown in FIG. 1.
Figure 11:
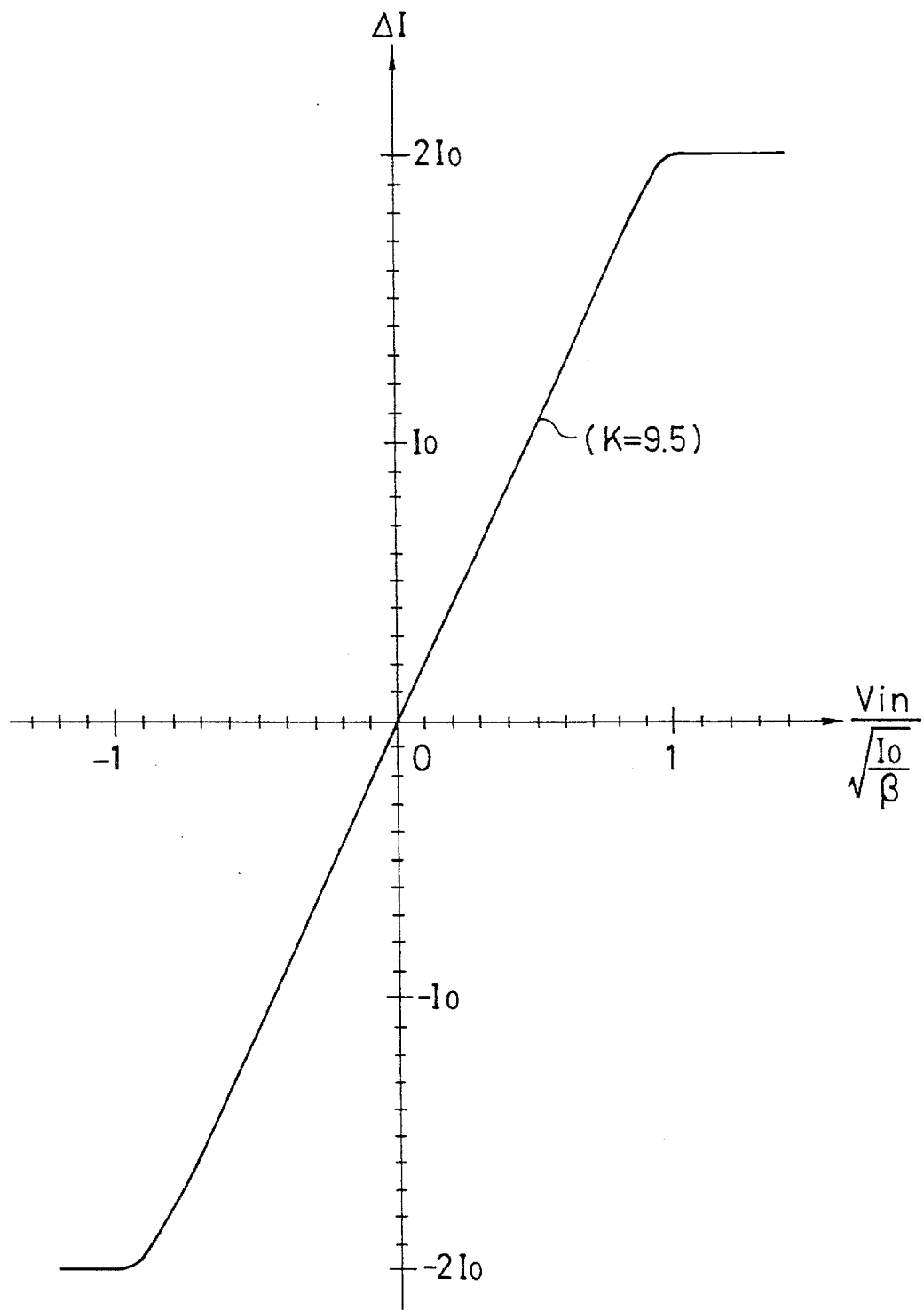
FIG. 11 shows an output characteristic of the differential amplifier circuit shown in FIG. 10.
Figure 12:
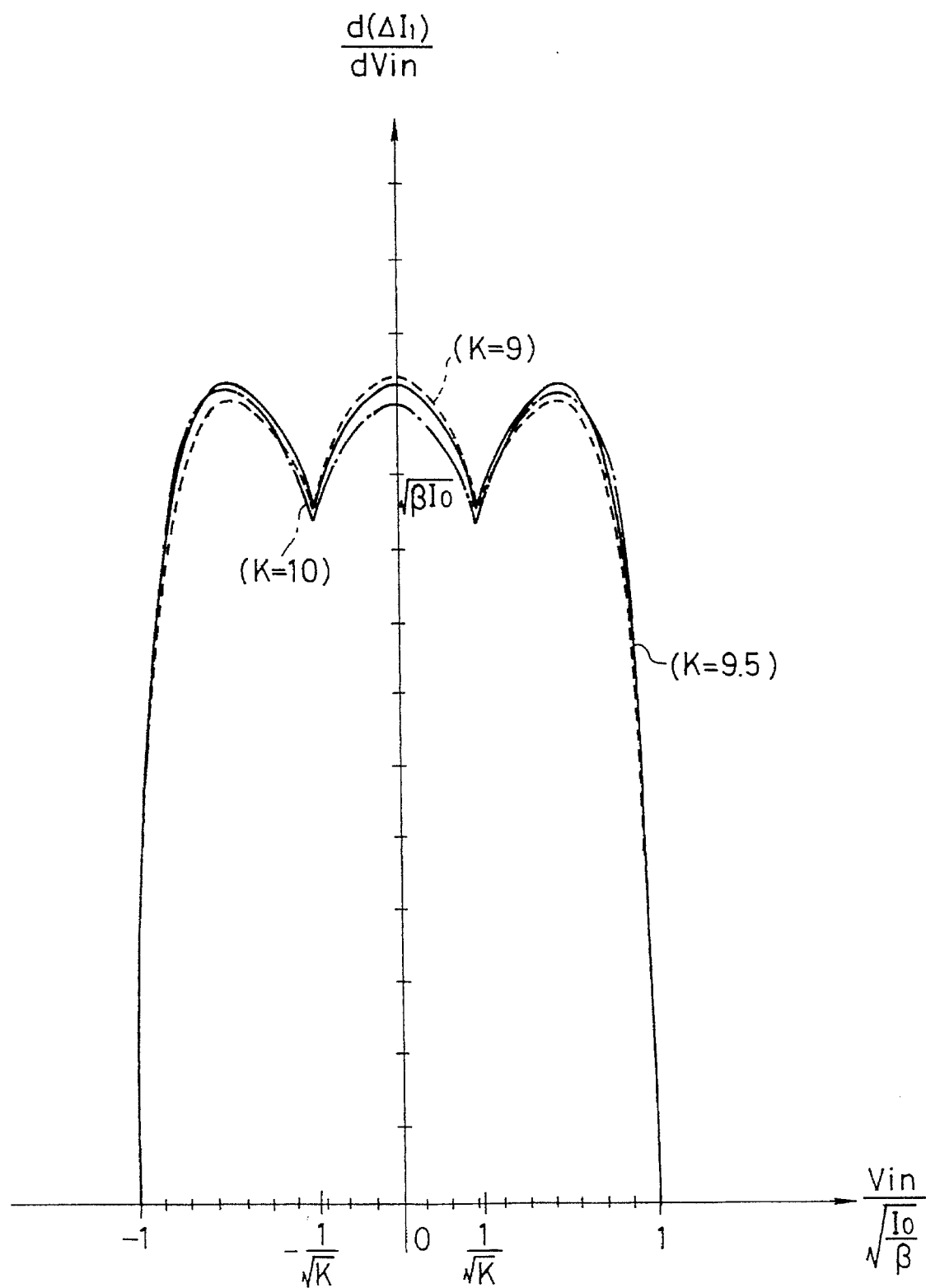
FIG. 12 shows a transconductance characteristic of the differential amplifier circuit shown in FIG. 10.

In the paper which discloses the prior-art differential amplifier circuit shown in FIG. 3, K is required to be set as 10 or more. However, it was found that this description is not correct and $K=9.5$ is the best. FIGS. 11 and 12 show the output characteristics and the transconductance characteristics, respectively.

It is seen from FIG. 12 that the transconductance fluctuation is restricted to −15% or less in the input voltage range of $|V_{in}| \leq 0.85 V_n$, where $V_u = (I_0/\beta)_{1/2}$. This means that the input voltage range which gives the transconductance having comparatively good linearity can be made wide sufficiently.

In a balanced differential pair formed of two transistors whose ratios (W/L) are equal to each other, in general, the transconductance fluctuation is about −30% in the input voltage range of $|V_{in}| \leq V_u$. Accordingly, it is seen that the transconductance linearity can be improved to 2 times as much as that of the circuit employing the balanced differential pairs by narrowing its input voltage range by about 15%.

The condition of $K=9.5$ can be realized with small gate sizes, or with restricting the transistor sizes, by the following method.

Similar to the prior-art differential amplifier circuit shown in FIG. 3, in the case that the gate-lengths of two MOS transistors forming an unbalanced differential pair are the same with each other and the gate-width of one of the transistor is K times as much as that of the other thereof, the sum $S_G$ of the gate areas of the two transistors is given as the following expression (46), where $S_{G1}$ and $S_{G2}$ are gate areas and $L_1$ and $L_2$, $W_1$ and $W_2$ are gate-lengths and gate-widths of these transistors, respectively.

$$S_G = S_{G1} + S_{G2} = L_1 W_1 (1+K) \tag{46}$$

Contrary, in this embodiment, the ratios of the gate-length and gate-width of the transistors are defined as the following expressions (47-1) and (47-2), respectively considering the relative ratio of (W/L) is K.

$$W_1/L_1 = (1/K)^{1/2} \tag{47-1}$$

$$W_2/L_2 = K^{1/2} \tag{47-2}$$

Next, the minimum of the sum $S_G$ of the gate areas $S_{G1}$ and $S_{G2}$, which is given as the following expression (48), is obtained.

$$S_G = S_{G1} + S_{G2} = L_1 W_1 + L_2 W_2 \tag{48}$$

For example, in the case that the minimums of $L_1$ and $W_1$ are both 3 μm, $S_G$=94.5 μm² from the expression (46) of the prior art and $S_G$=55.5 μm² from the expression (48) of this embodiment. This means that the sum of the gate areas in the embodiment can be reduced by 58.7%, which is equivalent to K=5.2 in the prior art. As described above, K=10 or more in the prior art as a result, it is seen that the transistor size can be reduced in the embodiment.

MOS transistors have comparatively large fabrication deviation, in general, so that the value of K deviates from the standard when K=9.5. In other words, even if the value of K is set as 9.5, the value deviates from 9.5 to 9 or 10. The transconductance curves of K=9.5, 9 and 10 are shown in FIG. 12, in which a curve of K=9.5 is indicated by a solid line, that of K=9 by a broken line and that of K=10 by a chain line. However, since both transistors are used as a pair, variation of their characteristics can be restricted if both transistors made matched.

As described above, the sizes of the transistors M2" and M4" each having the larger ratio (W/L) of each differential pair can be restricted to several times as much as those of the transistors M1" and M3" having the smaller ratios (W/L) thereof. As a result, the circuit scale can be reduced. In addition, a transconductance with comparatively good linearity can be obtained in a wider input voltage range.

Figure 4:
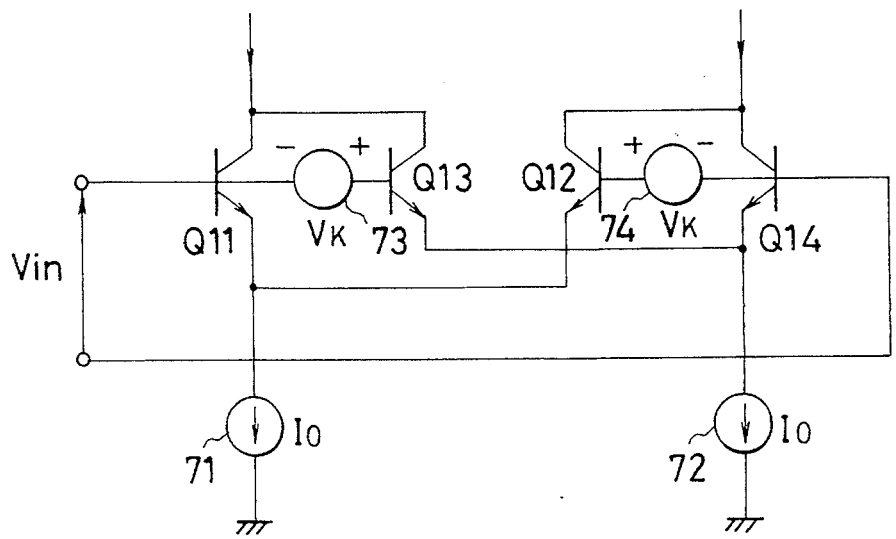
FIG. 4 is a circuit diagram of still another conventional differential amplifier circuit.
Figure 5:
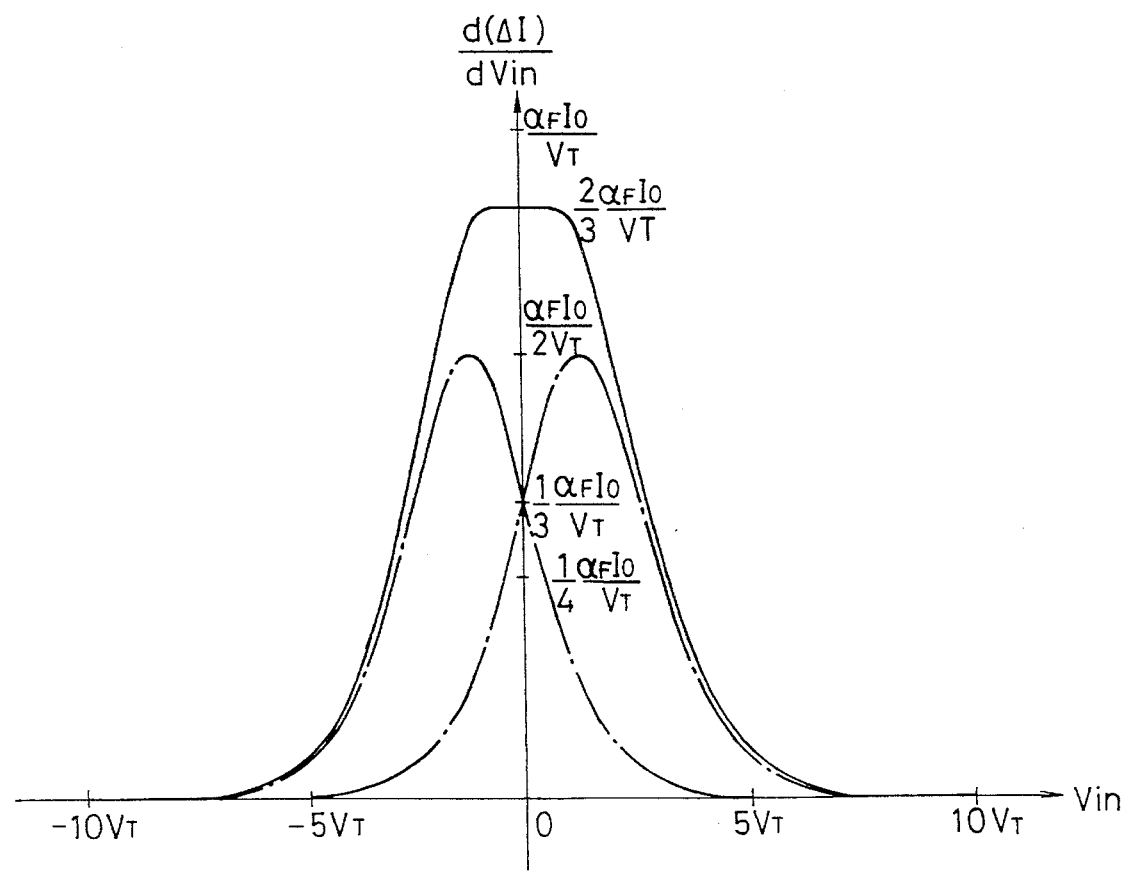
FIG. 5 shows a transconductance characteristic of the conventional differential amplifier circuit shown in FIG. 4.
Figure 13:
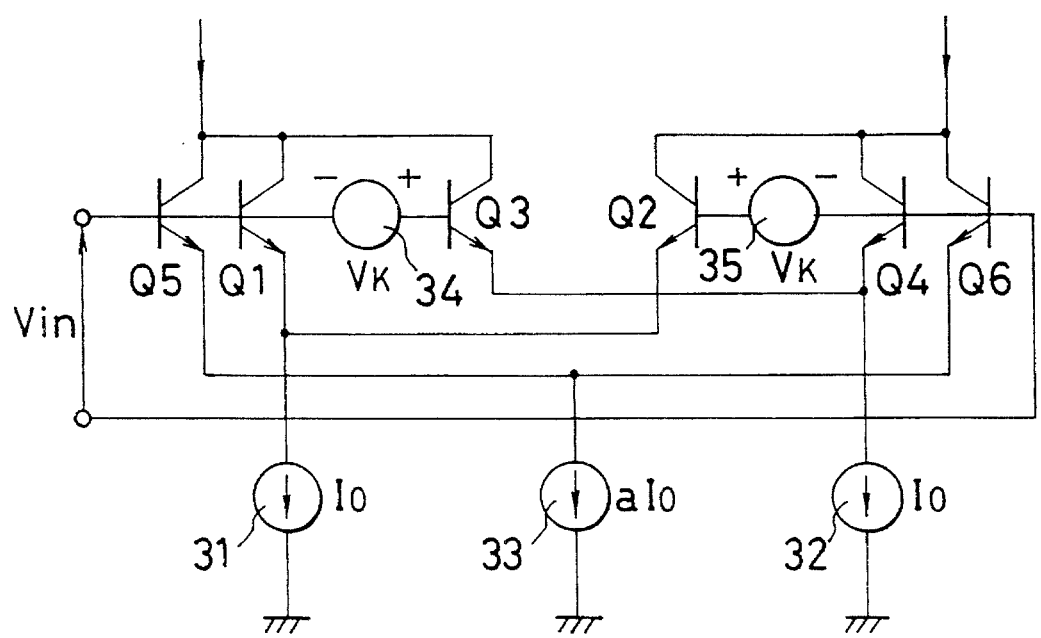
FIG. 13 is a circuit diagram of a differential amplifier circuit according to a fourth embodiment of the present invention.

FIG. 13 shows a differential amplifier circuit of a fourth embodiment, which is equivalent to that of the prior art shown in FIG. 4 in which a differential pair of transistors Q5 and Q6 driven by a constant current $aI_0$ is provided additionally.

In FIG. 13, NPN transistors Q1 and Q2 compose a first differential pair which is driven by a constant current source 31 whose current value is $I_0$. NPN transistors Q3 and Q4 compose a second differential pair which is driven by a constant current source 32 whose current value is $I_0$. NPN transistors Q5 and Q6 compose a third differential pair which is driven by a constant current source 33 whose current value is $aI_0$, where a≠1.

Bases of the transistors Q1 and Q5 are coupled together and bases of the transistors Q4 and Q6 are coupled together to form differential input ends. An input voltage $V_{in}$ is applied to the differential input ends thus formed.

Collectors of the transistors Q1, Q3 and Q5 are coupled together and collectors of the transistors Q2', Q4' and Q6' are coupled together to form differential output ends.

A first DC voltage $V_K$ is applied across the bases of the transistors Q1 and Q3 by a first DC voltage source 34, and a second DC voltage whose value is equal to that of the first DC voltage, or $V_K$, is applied across the bases of the transistors Q2 and Q4 by a second DC voltage source 15.

The polarity of the first DC voltage $V_K$ is made so that the voltage is high at the side of the transistor Q3 and low at the side of the transistor Q1. The polarity of the second DC voltage $V_K$ is made so that the voltage is high at the side of the transistor Q2 and low at the side of the transistor Q4.

Thus, in the first and second differential pairs, the DC voltages $V_K$ are applied as offset biases across the bases of the transistors Q1 and Q3 whose output ends are coupled together and the bases of the transistors Q2 and Q4 whose output ends are coupled together, respectively.

Next, the operation of the differential amplifier circuit is shown below.

The operations of the first differential pair of the transistors Q1 and Q2 and the second differential pairs of the transistors Q3 and Q4 are the same as those in the prior art shown in FIG. 4 which are shown by the equations (17) to (25). Therefore, for the sake of simplification of description, only the operation of the third differential pair of the transistors Q5 and Q6 is described here.

The difference $\Delta I_3$ of collector currents $I_{C5}$ and $I_{C6}$ of the transistors Q5 and Q6 is given as the following expression (49) and its transconductance $G_{m3}$ is given as the following expression (50).

$$\Delta I_3 = I_{C5} - I_{C5} = \alpha_F \, aI_0 \tan h\{V_{in}/(2V_T)\} \tag{49}$$

$$G_{m3} = d(\Delta I_3)/dV_{in} = \{(\alpha_F \, aI_0)/(2V_T)\} \cdot [1/\{\cos h^2(V_{in}/2V_T)\}] \tag{50}$$

Therefore, the differential output current $\Delta I$ of the differential amplifier circuit of the fourth embodiment shown in FIG. 13 is given as the following expression (51), and then its transconductance $G_m$ is given as the following expression (52).

$$\begin{aligned}
\Delta I &= \Delta I_1 + \Delta I_2 + \Delta I_3 \\
&= \alpha_F I_0 \, [\tanh\{(V_{in} - V_K)/2V_T\} + \\
&\quad \tanh\{(V_{in} + V_K)/2V_T\} + a \cdot \tanh(V_{in}/2V_T)]
\end{aligned} \tag{51}$$

$$\begin{aligned}
G_m &= G_{m1} + G_{m2} + G_{m3} \\
&= \frac{\alpha_F I_0}{2V_T} \left[ \frac{1}{\cosh^2\left(\frac{V_{in} - V_K}{2V_T}\right)} + \right. \\
&\quad \left. \frac{1}{\cosh^2\left(\frac{V_{in} + V_K}{2V_T}\right)} + \frac{a}{\cosh^2\left(\frac{V_{in}}{2V_T}\right)} \right]
\end{aligned} \tag{52}$$

Figure 14:
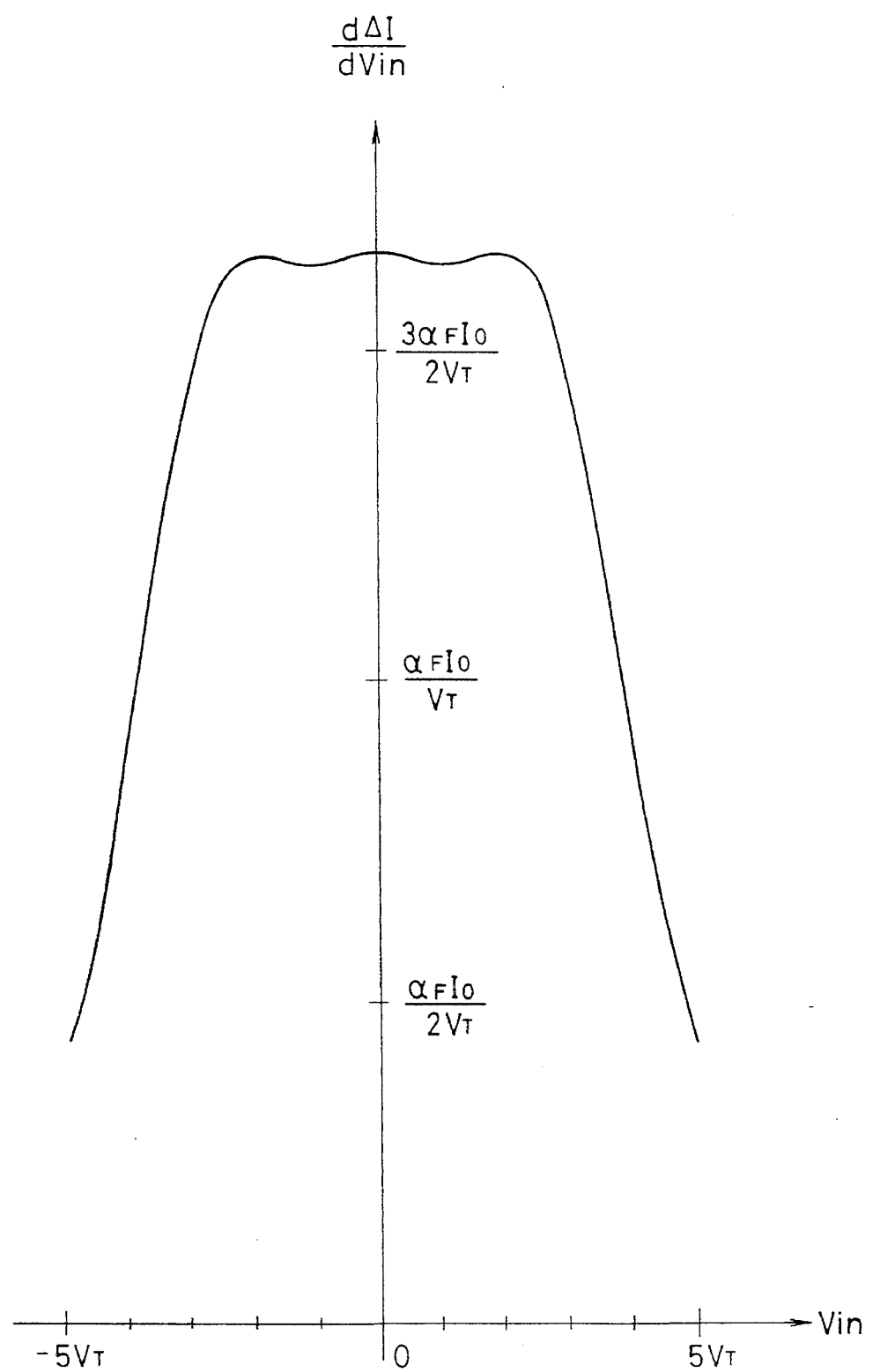
FIG. 14 shows a transconductance characteristic of the differential amplifier circuit shown in FIG. 13 in which $V_K=2.634$ $V_T$ and $(1/a)=(4/3)$.

FIG. 14 shows the transconductance characteristics thus obtained in which $V_K$=2.634 $V_T$ and (1/a)=(4/3). It is seen from FIG. 14 that the transconductance curve shows a ripple of ±1% or less at its each side is obtained and its fluctuation is limited to −1% or less in the input voltage range of $|V_{in}| \leq 2.4 \, V_T$.

Figure 15:
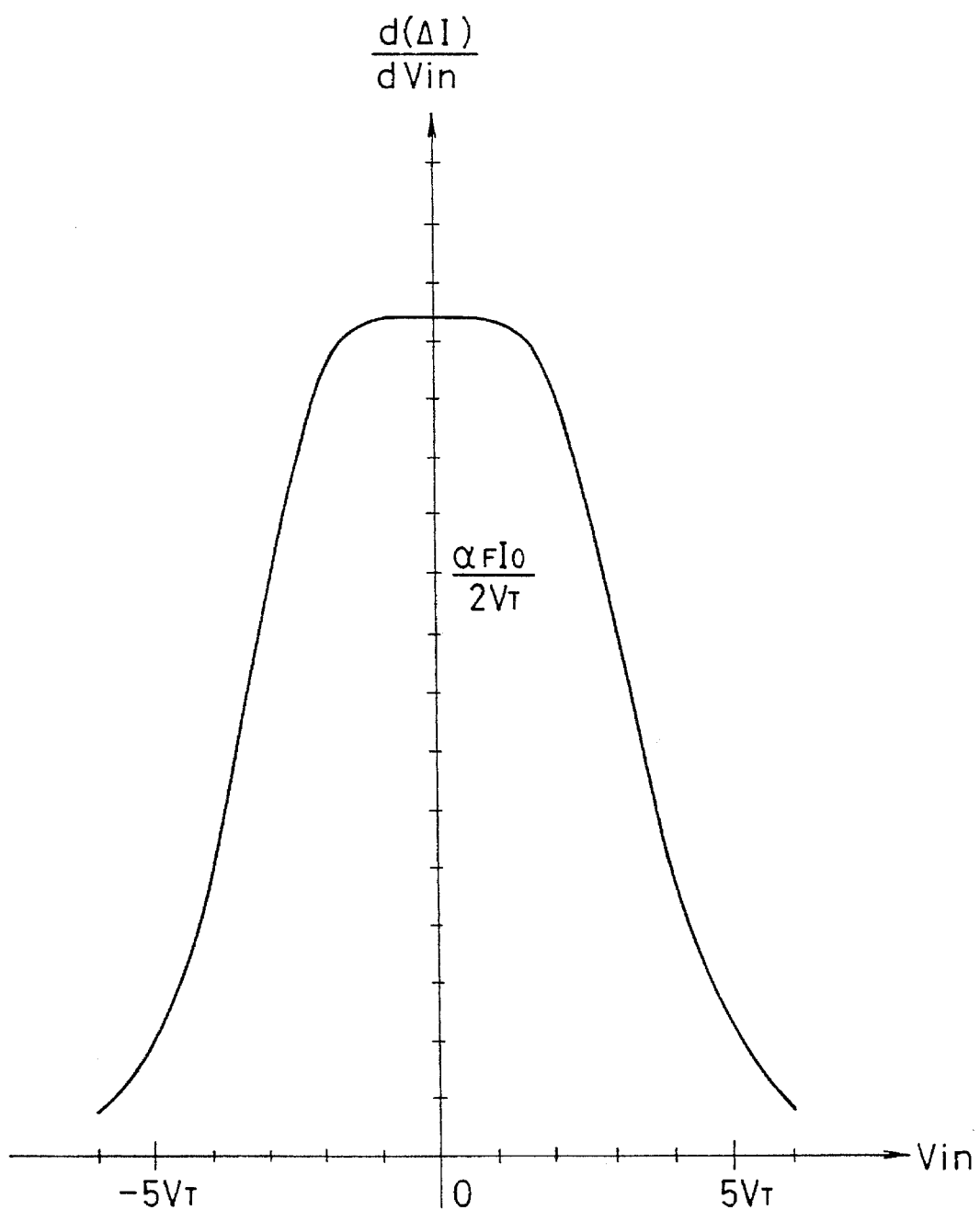
FIG. 15 shows a transconductance characteristic of the differential amplifier circuit shown in FIG. 13 in which $V_K=2.06344$ $V_T$ and $(1/a)=1.5625$.

FIG. 15 shows the transconductance characteristics in which $V_K$=2.06344 $V_T$ and (1/a)=1.5625. It is seen from FIG. 15 that the transconductance curve having a maximally flat is obtained and its fluctuation is limited to −1% or less in the input voltage range of $|V_{in}| \leq 1.3 \, V_T$.

Thus, the transconductance linearity of the differential amplifier circuit of the fourth embodiment can be improved over the prior art and as a result, the input voltage range can be enlarged.

In addition, since each differential pair may be composed of two minimum unit transistors, its high-frequency characteristics can be improved.

Figure 16:
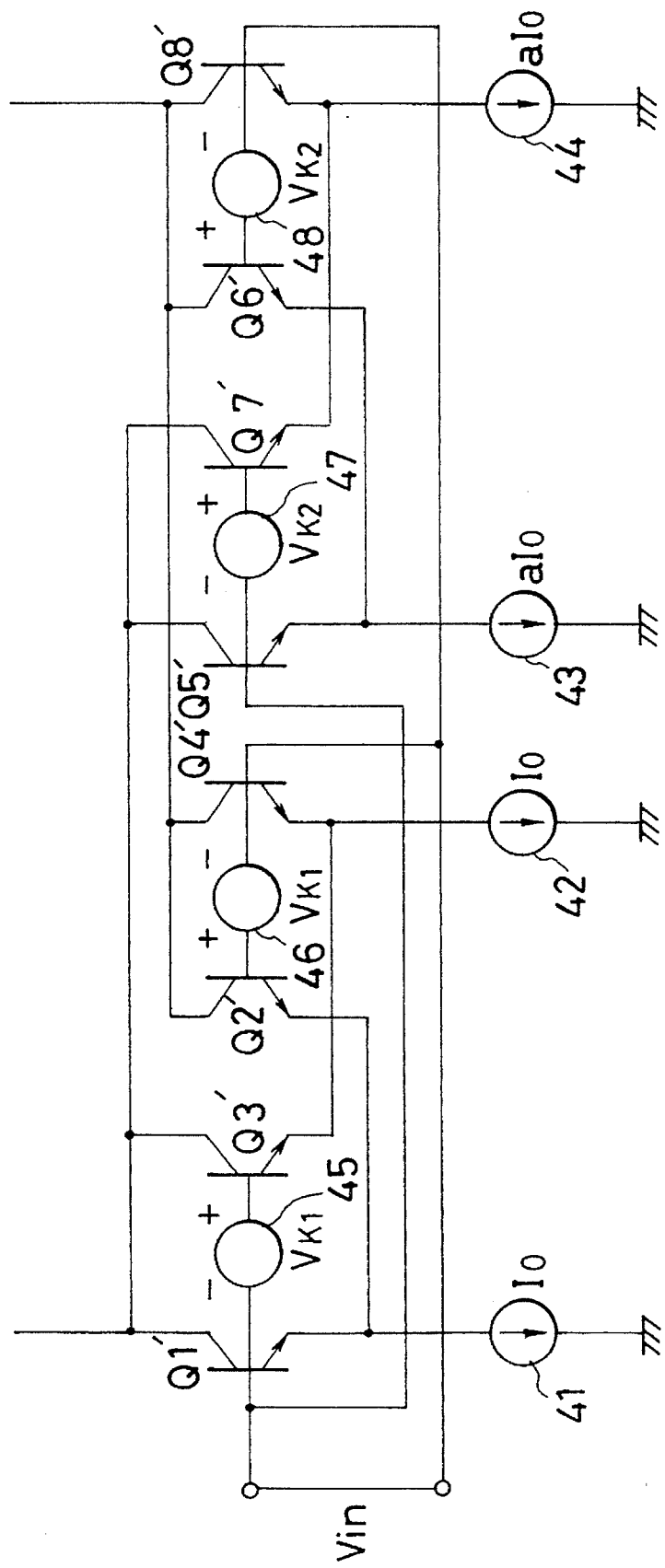
FIG. 16 is a circuit diagram of a differential amplifier circuit according to a fifth embodiment of the present invention.

FIG. 16 shows a differential amplifier circuit of a fifth embodiment, which is equivalent to that of two or the prior-art circuit shown in FIG. 4 are arranged together transversely.

In FIG. 16, NPN transistors Q1' and Q2' compose a first differential pair which is driven by a constant current source 41 whose current value is $I_0$. NPN transistors Q3' and Q4' compose a second differential pair which is driven by a constant current source 42 whose current value is $I_0$.

NPN transistors Q5' and Q6' compose a third differential pair which is driven by a constant current source 43 whose current value is $aI_0$ where $a \neq 1$. NPN transistors Q7' and Q8' compose a fourth differential pair which is driven by a constant current source 44 whose current value is $aI_0$.

Bases of the transistors Q1' and Q5' are coupled together and bases of the transistors Q4' and Q8' are coupled together to form differential input ends. An input voltage $V_{in}$ is applied across the differential input ends thus formed.

Collectors of the transistors Q1', Q3', Q5' and Q7' are coupled together and collectors of the transistors Q2', Q4' Q6' and Q8' are coupled together to form differential output ends.

A first DC voltage $V_{K1}$ is applied across the bases of the transistors Q1' and Q3' by a first DC voltage source 45, a second DC voltage whose value is equal to that of the first DC voltage, or $V_{K1}$, is applied across the bases of the transistors Q2' and Q4' by a second DC voltage source 46. A third DC voltage $V_{K2}$ is applied across the bases of the transistors Q5' and Q7' by a third DC voltage source 47, a fourth DC voltage whose value is equal to that of the third DC voltage, or $V_{K2}$, is applied across the bases of the transistors Q6' and Q8' by a fourth DC voltage source 48.

The polarity of the first DC voltage $V_{K1}$ is made so that the voltage is high at the side of the transistor Q3' and low at the side of the transistor Q1'. The polarity of the second DC voltage $V_{K1}$ is made so that the voltage is high at the side of the transistor Q2' and low at the side of the transistor Q4'. The polarity of the third DC voltage $V_{K2}$ is made so that the voltage is high at the side of the transistor Q7' and low at the side of the transistor Q5'. The polarity of the fourth DC voltage $V_{K2}$ is made so that the voltage is high at the side of the transistor Q6' and low at the side of the transistor Q8'.

Thus, in the first and second differential pairs, the first and second DC voltages $V_{K1}$ are applied as offset biases across the bases of the transistors Q1' and Q3' whose output ends are coupled together and the bases of the transistors Q2' and Q4' whose output ends are coupled together, respectively. Similarly, in the third and fourth differential pairs, the third and fourth DC voltages $V_{K2}$ are applied as offset biases across the bases of the transistors Q5' and Q7' whose output ends are coupled together and the bases of the transistors Q6' and Q8' whose output ends are coupled together, respectively.

Next, the operation of the differential amplifier circuit is shown below.

The current differences $\Delta I_1$, $\Delta I_2$, $\Delta I_3$ and $\Delta I_4$ of the first to fourth differential pairs are given as the following expressions (53-1), (53-2), (53-3) and (53-4), respectively.

$$\Delta I_1 = I_{C1} - I_{C2} = \alpha_F I_0 \tan h\{(V_{in} - V_{K1})/(2V_T)\} \quad (53\text{-}1)$$

$$\Delta I_2 = I_{C3} - I_{C4} = \alpha_F I_0 \tan h\{(V_{in} + V_{K1})/(2V_T)\} \quad (53\text{-}2)$$

$$\Delta I_3 = I_{C5} - I_{C6} = a\alpha_F I_0 \tan h\{(V_{in} - V_{K2})/(2V_T)\} \quad (53\text{-}3)$$

$$\Delta I_4 = I_{C7} - I_{C8} = a\alpha_F I_0 \tan h\{(V_{in} + V_{K2})/(2V_T)\} \quad (53\text{-}4)$$

Therefore, the differential output current $\Delta I$ is given as the following expressions (54), and then it transconductance $G_m$ is given as the following expression (55).

$$\Delta I = \Delta I_1 + \Delta I_2 + \Delta I_3 + \Delta I_4 \quad (54)$$

$$= \alpha_F I_0 \left[ \tanh\left(\frac{V_{in} - V_{K1}}{2V_T}\right) + \tanh\left(\frac{V_{in} + V_{K1}}{2V_T}\right) + a\left\{\tanh\left(\frac{V_{in} - V_{K2}}{2V_T}\right) + \tanh\left(\frac{V_{in} + V_{K2}}{2V_T}\right)\right\} \right]$$

$$\frac{d(\Delta I)}{dV_{in}} = G_m = G_{m1} + G_{m2} + G_{m3} + G_{m4} \quad (55)$$

$$= \frac{\alpha_F I_0}{2V_T} \left[ \frac{1}{\cosh^2\left(\frac{V_{in} - V_{K1}}{2V_T}\right)} + \frac{1}{\cosh^2\left(\frac{V_{in} + V_{K1}}{2V_T}\right)} + \frac{a}{\cosh^2\left(\frac{V_{in} - V_{K2}}{2V_T}\right)} + \frac{a}{\cosh^2\left(\frac{V_{in} + V_{K2}}{2V_T}\right)} \right]$$

Figure 17:
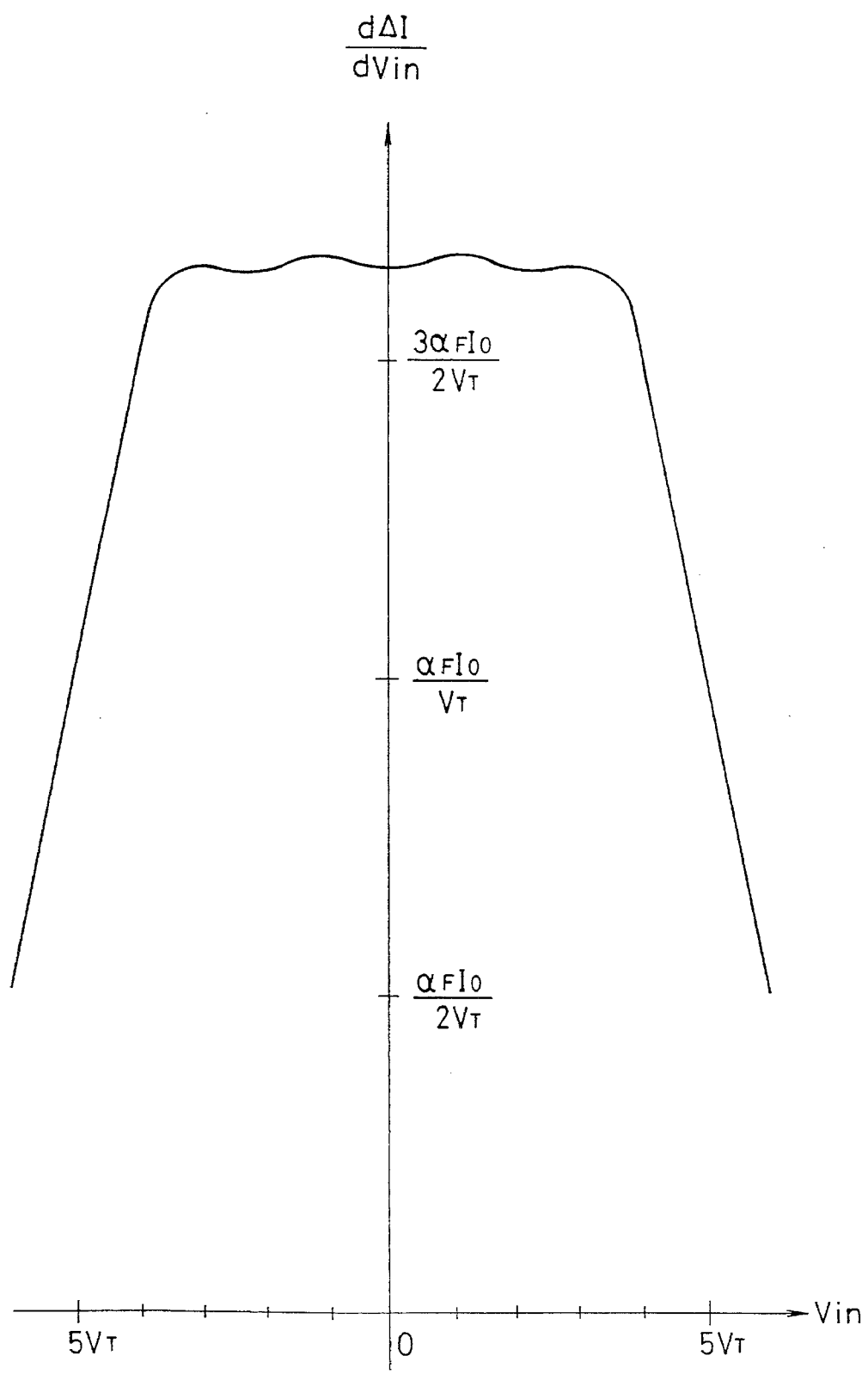
FIG. 17 shows a transconductance characteristic of the differential amplifier circuit shown in FIG. 16 in which $V_{K1}=1.2$ $V_T$, $V_{K2}=3.834$ $V_T$ and $a=1.3$.

FIG. 17 shows the transconductance characteristics thus obtained in which $V_{K1} = 1.2\ V_T$, $V_{K2} = 3.834\ V_T$ and $a = 1.3$ in the expression (54). It is seen from FIG. 17 that the transconductance fluctuation is limited to $-1\%$ or less in the input voltage range of $|V_{in}| \leq 3.5\ V_T$.

Figure 18:
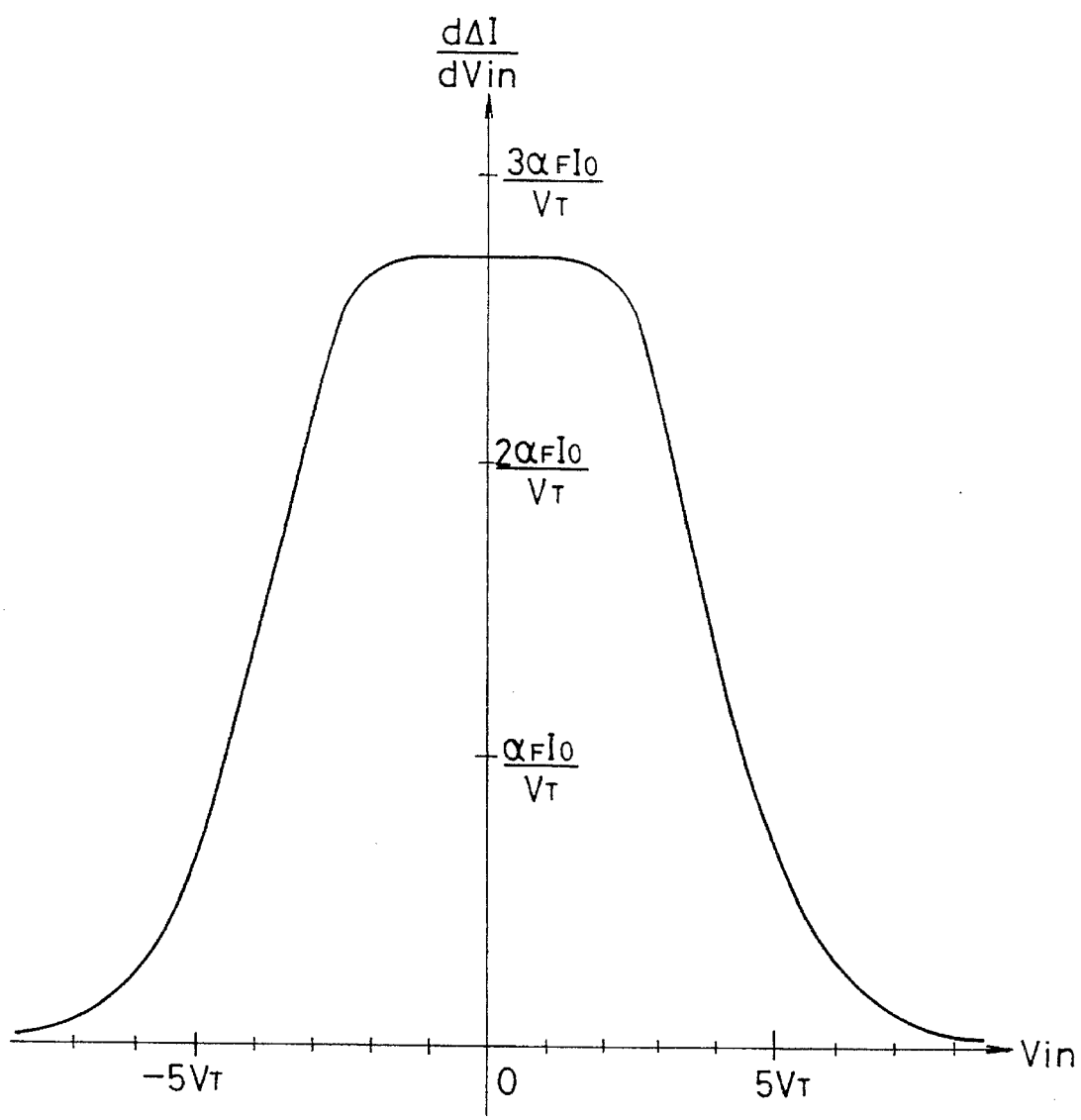
FIG. 18 shows a transconductance characteristic of the differential amplifier circuit shown in FIG. 16 in which $V_{K1}=0.70814$ $V_T$, $V_{K2}=2.59546$ $V_T$ and $(1/a)=1.82532$.

FIG. 18 shows the transconductance characteristics in which $V_{1K} = 0.70814\ V_T$, $V_{K2} = 2.59546\ V_T$ and $a = 1.82532$. It is seen from FIG. 18 that the transconductance curve having a maximally flat is obtained and its fluctuation is limited to $-1\%$ or less in the input voltage range of $|V_{in}| \leq 1.9\ V_T$.

Thus, similar to the fourth embodiment, the transconductance linearity of the differential amplifier circuit of the fifth embodiment can be improved over the prior art and as a result, the input voltage range can be enlarged.

In addition, since each differential pair may be composed of two minimum unit transistors, its high-frequency characteristics can be improved.

What is claimed is:

1. A differential amplifier circuit comprising:

a first differential pair formed of first and second transistors, which is driven by a first constant current source;

a ratio (W/L) of a gate-width W and a gate-length L of said second transistor being $K_1$ times as much as that of said first transistor where $K_1 \neq 1$;

a second differential pair formed of third and fourth transistors, which is driven by a second constant current source whose current value is equal to that of said first constant current source;

a ratio (W/L) of a gate-width W and a gate-length L of said third transistor being $K_2$ times as much as that of said fourth transistor where $K_2 \neq 1$;

gates of said first and third transistors being coupled together and gates of said second and fourth transistors being coupled together;

drains of said first and fourth transistors being coupled together and drains of said second and third transistors being coupled together;

a third differential pair formed of fifth and sixth transistors, which is driven by a third constant current source;

a ratio (W/L) of a gate-width W and a gate-length L of said sixth transistor being $K_3$ times as much as that of said fifth transistor where $K_3 \neq 1$;

a fourth differential pair formed of seventh and eighth transistors, which is driven by a fourth constant current source whose current value is equal to that of said third constant current source;

a ratio (W/L) of a gate-width W and a gate-length L of said seventh transistor being $K_4$ times as much as that of said eighth transistor where $K_4 \neq 1$;

gates of said fifth and seventh transistors being coupled together and gates of said sixth and eighth transistors being coupled together; and drains of said fifth and eighth transistors being coupled together and drains of said sixth and seventh transistors being coupled together;

wherein said gates of said first and third transistors and said gates of said fifth and seventh transistors are coupled together to form one of differential input ends, and said gates of said second and fourth transistors and said gates of said sixth and eighth transistors are coupled together to form the other of said differential input ends;

said drains of said first and fourth transistors and said drains of said sixth and seventh transistors are coupled together to form one of differential output ends, and said drains of said second and third transistors and said drains of said fifth and eighth transistors are coupled together to form the other of said differential output ends; and at least one of said ratios (W/L) of said fifth and eighth transistors is different from at least one of said ratios (W/L) of said first and fourth transistors.

2. A differential amplifier circuit comprising:

a first differential pair formed of first and second transistors, which is driven by a first constant current source;

a ratio (W/L) of a gate-width W and a gate-length L of said second transistor being $K_1$ times as much as that of said first transistor where $K_1 \neq 1$;

a second differential pair formed of third and fourth transistors, which is driven by a second constant current source whose current value is equal to that of said first constant current source;

a ratio (W/L) of a gate-width W and a gate-length L of said third transistor being $K_2$ times as much as that of said fourth transistor where $K_2 \neq 1$;

gates of said first and third transistors being coupled together and gates of said second and fourth transistors being coupled together;

drains of said first and fourth transistors being coupled together and drains of said second and third transistors being coupled together;

a third differential pair formed of fifth and sixth transistors, which is driven by a third constant current source;

a ratio (W/L) of a gate-width W and a gate-length L of said sixth transistor being $K_3$ times as much as that of said fifth transistor where $K_3 \neq 1$;

a fourth differential pair formed of seventh and eighth transistors, which is driven by a fourth constant current source whose current value is equal to that of said third constant current source;

a ratio (W/L) of a gate-width W and a gate-length L of said seventh transistor being $K_4$ times as much as that of said eighth transistor where $K_4 \neq 1$;

gates of said fifth and seventh transistors being coupled together and gates of said sixth and eighth transistors being coupled together; and drains of said fifth and eighth transistors being coupled together and drains of said sixth and seventh transistors being coupled together;

wherein said gates of said first and third transistors and said gates of said fifth and seventh transistors are coupled together to form one of differential input ends, and said gates of said second and fourth transistors and said gates of said sixth and eighth transistors are coupled together to form the other of said differential input ends;

said drains of said first and fourth transistors and said drains of said sixth and seventh transistors are coupled together to form one of differential output ends, and said drains of said second and third transistors and said drains of said fifth and eighth transistors are coupled together to form the other of said differential output ends; and at least one of $K_3$ and $K_4$ of said third and fourth differential pairs is different from at least one of $K_1$ and $K_2$ of said first and second differential pairs.

3. A differential amplifier circuit comprising:

a first differential pair formed of first and second transistors, which is driven by a first constant current source;

a ratio (W/L) of a gate-width W and a gate-length L of said second transistor being $K_1$ times as much as that of said first transistor where $K_1 \neq 1$;

a second differential pair formed of third and fourth transistors, which is driven by a second constant current source whose current value is equal to that of said first constant current source;

a ratio (W/L) of a gate-width W and a gate-length L of said third transistor being $K_2$ times as much as that of said fourth transistor where $K_2 \neq 1$;

gates of said first and third transistors being coupled together and gates of said second and fourth transistors being coupled together;

drains of said first and fourth transistors being coupled together and drains of said second and third transistors being coupled together;

a third differential pair formed of fifth and sixth transistors, which is driven by a third constant current source;

a ratio (W/L) of a gate-width W and a gate-length L of said sixth transistor being $K_3$ times as much as that of said fifth transistor where $K_3 \neq 1$;

a fourth differential pair formed of seventh and eighth transistors, which is driven by a fourth constant current source whose current value is equal to that of said third constant current source;

a ratio (W/L) of a gate-width W and a gate-length L of said seventh transistor being $K_4$ times as much as that of said eighth transistor where $K_4 \neq 1$;

gates of said fifth and seventh transistors being coupled together and gates of said sixth and eighth transistors being coupled together; and drains of said fifth and eighth transistors being coupled together and drains of said sixth and seventh transistors being coupled together;

wherein said gates of said first and third transistors and said gates of said fifth and seventh transistors are coupled together to form one of differential input ends, and said gates of said second and fourth transistors and said gates of said sixth and eighth transistors are coupled together to form the other of said differential input ends;

said drains of said first and fourth transistors and said drains of said sixth and seventh transistors are coupled together to form one of differential output ends, and said drains of said second and third transistors and said drains of said fifth and eighth transistors are coupled together to form the other of said differential output ends; and said current values of said first and second constant current sources are different from those of said third and fourth constant current sources.

4. A differential amplifier circuit comprising:

a first differential pair formed of first and second transistors, which is driven by a first constant current source;

a ratio (W/L) of a gate-width W and a gate-length L of said second transistor being K times as much as that of said first transistor where K≠1;

a second differential pair formed of third and fourth transistors, which is driven by a second constant current source whose current value is equal to that of said first constant current source;

a ratio (W/L) of a gate-width W and a gate-length L of said third transistor being K times as much as that of said fourth transistor;

gates of said first and third transistors being coupled together and gates of said second and fourth transistors being coupled together;

drains of said first and fourth transistors being coupled together and drains of said second and third transistors being coupled together;

a third differential pair formed of fifth and sixth transistors, which is driven by a third constant current source;

a ratio (W/L) of a gate-width W and a gate-length L of said fifth transistor being b times as much as that of said first transistor where b≠1, and a ratio (W/L) of a gate-width W and a gate-length L of said sixth transistor being K'b times as much as that of said first transistor where K'≠1;

a fourth differential pair formed of seventh and eighth transistors, which is driven by a fourth constant current source whose current value is equal to that of said third constant current source;

a ratio (W/L) of a gate-width W and a gate-length L of said seventh transistor being K'b times as much as that of said first transistor, and a ratio (W/L) of a gate-width W and a gate-length L of said eighth transistor being b times as much as that of said first transistor;

gates of said fifth and seventh transistors being coupled together and gates of said sixth and eighth transistors being coupled together; and drains of said fifth and eighth transistors being coupled together and drains of said sixth and seventh transistors being coupled together;

wherein said gates of said first and third transistors and said gates of said fifth and seventh transistors are coupled together to form one of differential input ends, and said gates of said second and fourth transistors and said gates of said sixth and eighth transistors are coupled together to form the other of said differential input ends;

said drains of said first and fourth transistors and said drains of said sixth and seventh transistors are coupled together to form one of differential output ends, and said drains of said second and third transistors and said drains of said fifth and eighth transistors are coupled together to form the other of said differential output ends; and said current values of said third and fourth constant current sources are a times as much as those of said first and second constant current sources where a≠1.

5. A differential amplifier circuit comprising:

a first differential pair formed of first and second transistors, which is driven by a first constant current source;

a ratio (W/L) of a gate-width W and a gate-length L of said second transistor being equal to that of said first transistor;

a second differential pair formed of third and fourth transistors, which is driven by a second constant current source whose current value is equal to that of said first constant current source;

a ratio (W/L) of a gate-width W and a gate-length L of said fourth transistor being equal to that of said third transistor;

a third differential pair formed of fifth and sixth transistors, which is driven by a third constant current source whose current value is different from those of said first and second constant current sources;

a ratio (W/L) of a gate-width W and a gate-length L of said sixth transistor being equal to that of said fifth transistor;

said ratio (W/L) of said fifth and sixth transistors being different from those of said first, second, third and fourth transistors;

gates of said first and third transistors being coupled together and gates of said second and fourth transistors being coupled together to form differential input ends; and drains of said first, third and sixth transistors being coupled together and drains of said second, fourth and fifth transistors being coupled together to form differential output ends;

wherein a first DC voltage is applied across said gates of said first and third transistors and a second DC voltage is applied across said gates of said second and fourth transistors; and a polarity of said first DC voltage with respect to said gate of said first transistor is the same as that of said second DC voltage with respect to said gate of said fourth transistor.

6. A differential amplifier circuit as claimed in claim 5, wherein said ratios (W/L) of said first, second, third and fourth transistors are equal to each other, and values of said first and second DC voltages are equal to each other.

7. A differential amplifier circuit comprising:

a first differential pair formed of first and second transistors, which is driven by a first constant current source;

a ratio (W/L) of a gate-width W and a gate-length L of said second transistor being K times as much as that of said first transistor where K≠1;

a second differential pair formed of third and fourth transistors, which is driven by a second constant current source whose current value is equal to that of said first constant current source;

a ratio (W/L) of a gate-width W and a gate-length L of said fourth transistor being K times as much as that of said third transistor;

gates of said first and fourth transistors being coupled together to form one of differential input ends and gates of said second and third transistors being coupled together to form the other of said differential input ends; and drains of said first and third transistors being coupled together to form one of differential output ends and drains of said second and fourth transistors being coupled together to form the other of said differential output ends;

wherein said ratio K is 9.5.

8. A differential amplifier circuit as claimed in claim 7, wherein said gate-lengths L of said first and third transistors are equal to each other.

9. A differential amplifier circuit comprising:

a first differential pair formed of first and second transistors, which is driven by a first constant current source;

a second differential pair formed of third and fourth transistors, which is driven by a second constant current source whose current value is equal to that of said first constant current source;

a third differential pair formed of fifth and sixth transistors, which is driven by a third constant current source whose current value is different from those of said first and second constant current sources;

bases of said first and fifth transistors being coupled together and bases of said fourth and sixth transistors being coupled together to form differential input ends; and collectors of said first, third and fifth transistors being coupled together and drains of said second, fourth and sixth transistors being coupled together to form differential output ends;

wherein a first DC voltage is applied across said bases of said first and third transistors and a second DC voltage is applied across said bases of said second and fourth transistors; and a polarity of said first DC voltage with respect to said base of said first transistor is the same as that of said second DC voltage with respect to said base of said fourth transistor.

10. A differential amplifier circuit as claimed in claim 9, wherein values of said first and second DC voltages are both 2.634 $V_T$, where $V_T$ is the thermal voltage defined as $V_T=(k_BT/q)$ where $K_B$ is Boltzmann's constant, T is absolute temperature and q is the charge of an electron; and values of said first and second constant current sources are both (4/3) times as much as that of said third constant current sources.

11. A differential amplifier circuit as claimed in claim 9, wherein values of said first and second DC voltages are both 2.06344 $V_T$, where $V_T$ is the thermal voltage defined as $V_T=(k_BT/q)$ where $K_B$ is Boltzmann's constant, T is absolute temperature and q is the charge of an electron; and values of said first and second constant current sources are both 1.5625 times as much as that of said third constant current source.

12. A differential amplifier circuit comprising:

a first differential pair formed of first and second transistors, which is driven by a first constant current source;

a second differential pair formed of third and fourth transistors, which is driven by a second constant current source whose current value is equal to that of said first constant current source;

a third differential pair formed of fifth and sixth transistors, which is driven by a third constant current source whose current value is different from those of said first and second constant current sources;

a fourth differential pair formed of seventh and eighth transistors, which is driven by a fourth constant current source whose current value is different from those of said first and second constant current sources;

bases of said first and fifth transistors being coupled together and bases of said fourth and eighth transistors being coupled together to form differential input ends; and collectors of said first, third, fifth and seventh transistors being coupled together and collectors of said second, fourth, sixth and eighth transistors being coupled together to form differential output ends;

wherein a first DC voltage is applied across said bases of said first and third transistors, a second DC voltage is applied across said bases of said second and fourth transistors, a third DC voltage is applied across said bases of said fifth and seventh transistors, and a fourth DC voltage is applied across said bases of said sixth and eighth transistors; and a polarity of said first DC voltage with respect to said base of said first transistor is the same as that of said second DC voltage with respect to said base of said fourth transistor, and a polarity of said third DC voltage with respect to said base of said fifth transistor is the same as that of said fourth DC voltage with respect to said base of said eighth transistor.

13. A differential amplifier circuit as claimed in claim 12, wherein values of said first and second DC voltages are both 1.2 $V_T$ and those of said third and fourth DC voltages are both 3.834 $V_T$, where $V_T$ is the thermal voltage defined as $V_T=(k_BT/q)$ where $K_B$ is Boltzmann's constant, T is absolute temperature and q is the charge of an electron; and values of said third and fourth constant current sources are both 1.3 times as much as those of said first and second constant current sources.

14. A differential amplifier circuit as claimed in claim 12, wherein values of said first and second DC voltages are both 0.70814 $V_T$ and those of said third and fourth DC voltages are both 2.59546 $V_T$, where $V_T$ is the thermal voltage defined as $V_T=(k_BT/q)$ where $K_B$ is Boltzmann's constant, T is absolute temperature and q is the charge of an electron; and values of said third and fourth constant current sources are both 1.82532 times as much as those of said first and second constant current sources.

* * * * *

UNITED STATES PATENT AND TRADEMARK OFFICE
CERTIFICATE OF CORRECTION

PATENT NO.    : 5,500,623
DATED         : March 19, 1996
INVENTOR(S)   : Katsuji KIMURA It is certified that error(s) appears in the above-identified patent and that said Letters Patent is hereby corrected as shown below:

Column 4,  line 28,   delete "$I_{24}$" and insert --$I_{D24}$--;

Column 6,  line 28,   delete "$\cosh^3$" and insert --$\cosh^2$--.

Column 11, line 65,   delete "$Id_{d1}$" and insert --$I_{d1}$--.

Column 12, line 12,   delete "$Id_{d1}$" and insert --$I_{d1}$--;

line 21,   delete "$Id_{d1}$" and insert --$I_{d1}$--;

line 23,   delete "$Id_{d3}$" and insert --$I_{d3}$--.

Column 13, line 4,    delete "$I_1$" and insert --$\Delta I_1$--.

Signed and Sealed this

Sixteenth Day of July, 1996

Attest:

BRUCE LEHMAN

Attesting Officer    Commissioner of Patents and Trademarks